(12) United States Patent
Bregoli et al.

(10) Patent No.: US 12,148,473 B2
(45) Date of Patent: Nov. 19, 2024

(54) NON-VOLATILE MEMORY CELL WITH SINGLE POLY, FLOATING GATE EXTENDING OVER TWO WELLS

(71) Applicants: STMicroelectronics S.r.l., Agrate Brianza (IT); STMicroelectronics International N.V., Geneva (CH)

(72) Inventors: Roberto Bregoli, Offlaga (IT); Vikas Rana, Noida (IN)

(73) Assignees: STMicroelectronics International N.V., Geneva (CH); STMicroelectronics S.r.l., Agrate Brianza (IT)

(*) Notice: Subject to any disclaimer, the term of this patent is extended or adjusted under 35 U.S.C. 154(b) by 147 days.

(21) Appl. No.: 17/697,846

(22) Filed: Mar. 17, 2022

(65) Prior Publication Data

US 2022/0319598 A1 Oct. 6, 2022

(30) Foreign Application Priority Data

Mar. 31, 2021 (IT) .......................... 102021000008075

(51) Int. Cl.
*G11C 16/04* (2006.01)
*G11C 16/10* (2006.01)
(Continued)

(52) U.S. Cl.
CPC ............ *G11C 16/045* (2013.01); *G11C 16/10* (2013.01); *G11C 16/14* (2013.01); *G11C 16/26* (2013.01); *H10B 41/35* (2023.02); *H10B 41/70* (2023.02)

(58) Field of Classification Search
None
See application file for complete search history.

(56) References Cited

U.S. PATENT DOCUMENTS 7,447,064 B1 11/2008 Bu et al.
2003/0183871 A1* 10/2003 Dugger ............ H03K 19/17732
257/314

(Continued)

OTHER PUBLICATIONS

Ohnakado, T. et al., "Device Characteristics of 0.35 μm P-Channel DINOR Flash Memory Using Band-to-Band Tunneling-Induced Hot Electron (BBHE) Programming," IEEE Transactions on Electron Devices, vol. 46, No. 9, Sep. 1999, 6 pages.

(Continued)

*Primary Examiner* — J. H. Hur
(74) *Attorney, Agent, or Firm* — Slater Matsil, LLP

(57) ABSTRACT

In an embodiment a non-volatile memory cell includes a substrate, a first body in the substrate, a second body in the substrate, a first storage transistor having a first conduction region and a second conduction region in the first body, the first and second conduction regions delimiting a first channel region in the first body, a first control gate region in the second body, an insulating region overlying the substrate, a single floating gate region extending on the substrate and embedded in the insulating region, the single floating gate region having a first portion on the first body and a second portion on the second body, the first portion and second portion being connected and electrically coupled, a first selection via extending through the insulating region and electrically coupling the first conduction region with a first conduction node, a second selection via extending through the insulating region and electrically coupling the second conduction region with a second conduction node and a first control via extending though the insulating region and electrically coupling the first control gate region with a first control node.

21 Claims, 13 Drawing Sheets

(51) Int. Cl.
    *G11C 16/14*     (2006.01)
    *G11C 16/26*     (2006.01)
    *H10B 41/35*     (2023.01)
    *H10B 41/70*     (2023.01)

(56) References Cited

U.S. PATENT DOCUMENTS

| | | |
|---|---|---|
| 2007/0145459 A1* | 6/2007 | Park .................. H10B 69/00 257/314 |
| 2010/0157690 A1 | 6/2010 | Jung |
| 2011/0157977 A1 | 6/2011 | Pasotti et al. |
| 2013/0294172 A1 | 11/2013 | Park et al. |

OTHER PUBLICATIONS

Peters et al., 'A 130nm high-density embedded EEPROM as universal memory for code and data storage, Nov. 30, 2004, Medea WS Testing, Munich, Germany, Infineon Technologies, 10 pages.

* cited by examiner

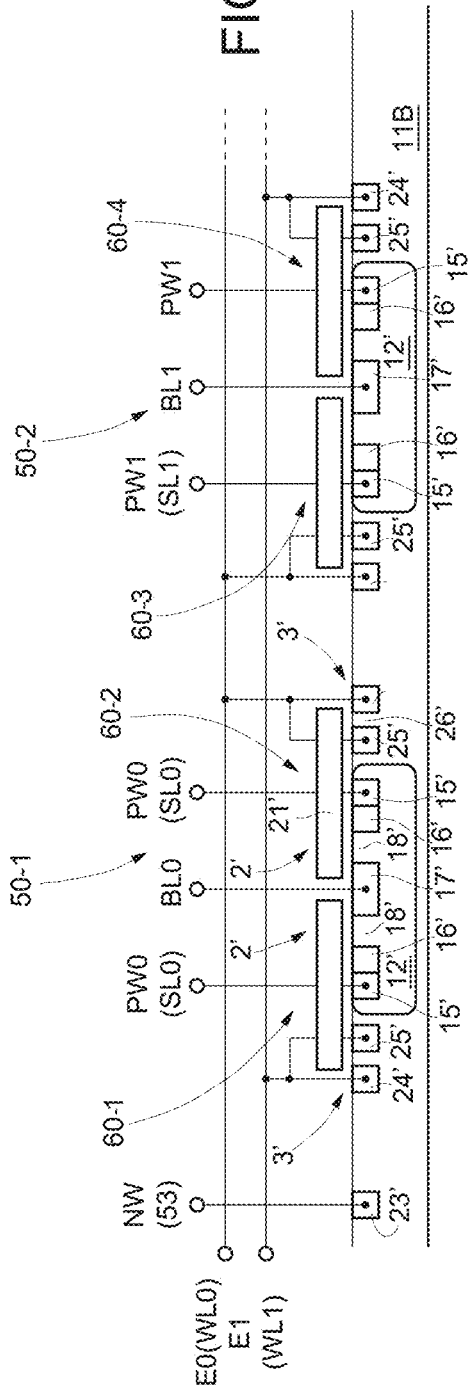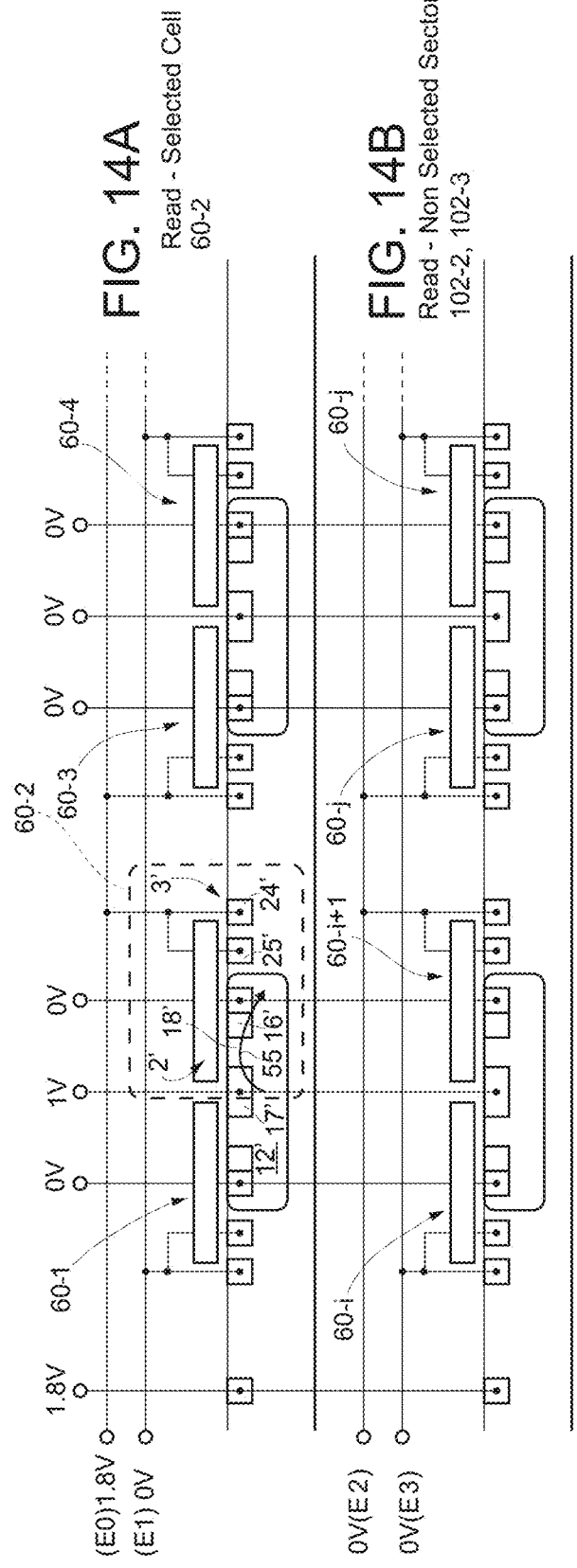

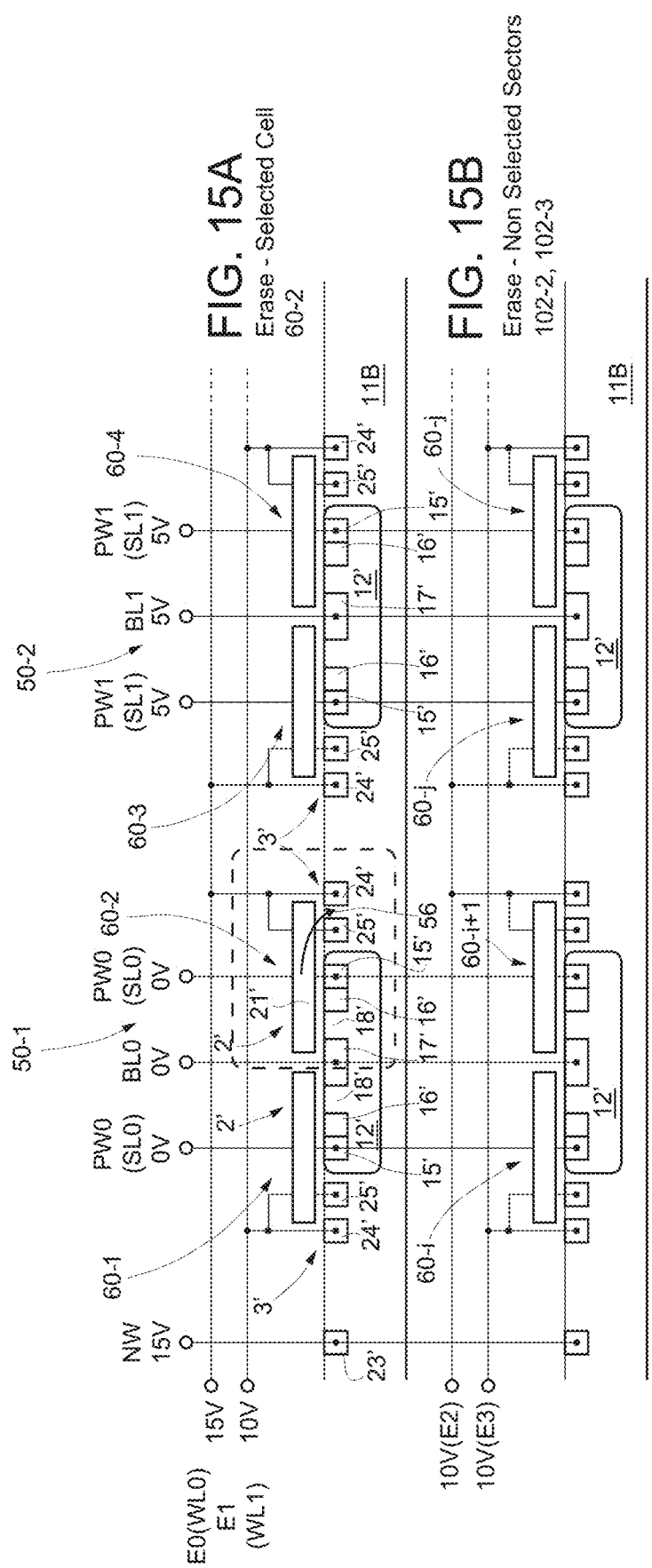

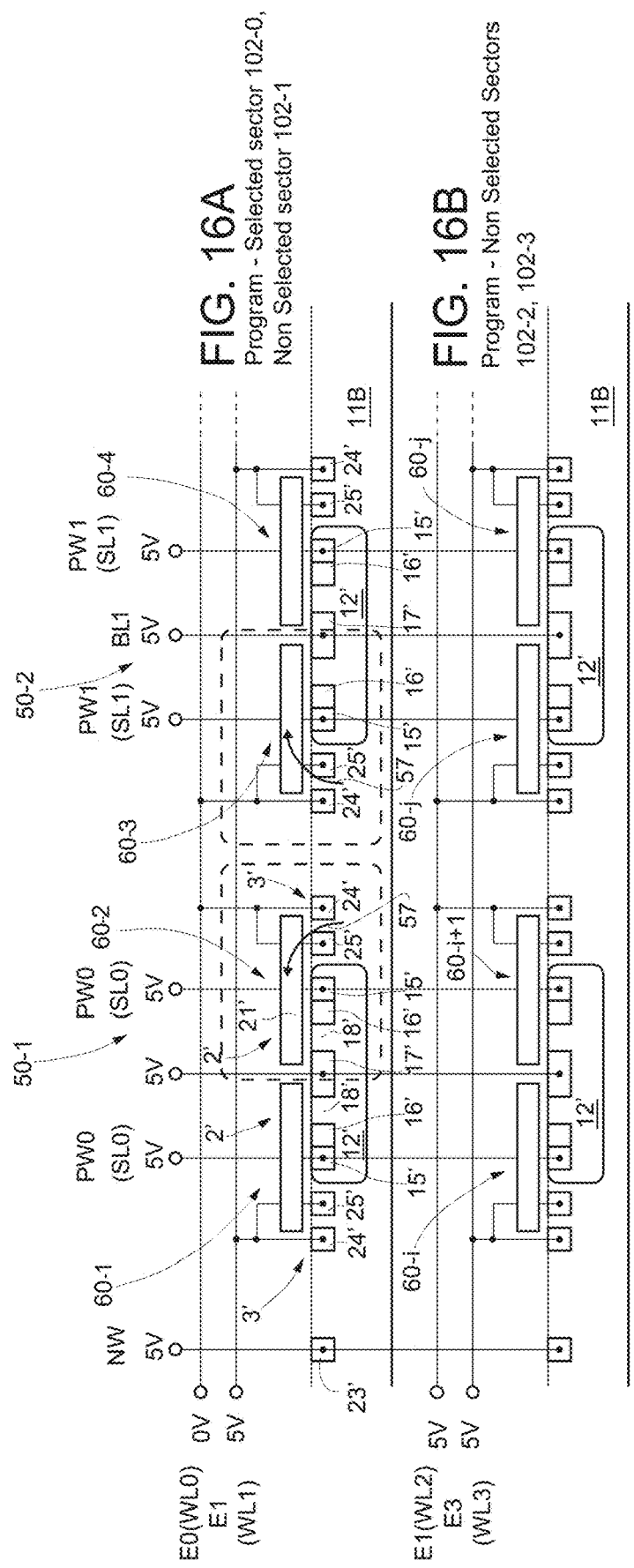

NON-VOLATILE MEMORY CELL WITH SINGLE POLY, FLOATING GATE EXTENDING OVER TWO WELLS

CROSS-REFERENCE TO RELATED APPLICATIONS

This application claims the benefit of Italian Application No. 102021000008075, filed on Mar. 31, 2021, which application is hereby incorporated herein by reference.

TECHNICAL FIELD

The present invention relates to a single poly, floating gate, Few Time Programmable (FTP) non-volatile memory device and to as biasing method thereof.

BACKGROUND

As is known, a non-volatile memory device comprises an array of memory cells configured to store different quantities of electric charges in the floating gate so as to set different levels of the threshold voltage and thus store different logic values.
Generally, in this type of memory devices, the operation of injecting electric charges into the floating gate region is called "programming" and the operation of extracting electric charges is called "erasing."
In some non-volatile, FTP memory devices, each memory cell has a floating gate region that is capacitively coupled with an implanted control region and is formed in the same polysilicon layer as the control gate region of selection transistors.
Thereby, manufacture of the FTP memory devices may be based on standard CMOS production processes and is highly simplified. FTP memory devices are suitable for applications where modification of the stored logic levels is relatively seldom compared with reading.
US Patent Application Publication No. 2011/0157977 discloses an FTP memory device wherein each cell includes a well accommodating a selection transistor and a storage transistor, coupled in series. The storage transistor has a floating gate capacitively coupled to a control gate terminal. The storage transistor is both programmed and erased using the Fowler-Nordheim effect.
Thereby, low programming current are used, power consumption is low, the control circuitry is simplified and the memory device may be designed so as to have small size.
Although representing a considerable improvement with respect to previous FTP memory devices, the solution taught in US Patent Application Publication No. 2011/0157977 may still be improved as regards the area occupied by the memory cells.

SUMMARY

Various embodiments provide memory devices of the FTP type with small dimensions. Understanding that the array area takes a big share of the total area (70-80%) of the memory devices and any improvement in the cell area results in a dramatic improvement in the efficiency of the memory devices.
Thus, embodiments provide an FTP memory device having reduced dimensions.
Various further embodiments provide a non-volatile memory cell, a non-volatile memory array and a method to operate those.

BRIEF DESCRIPTION OF THE DRAWINGS

For the understanding of the present invention, embodiments thereof are now described, purely as a non-limitative example, with reference to the enclosed drawings, wherein:
FIG. 13 shows generic biasing of four memory cells belonging to two adjacent, twin sectors of the memory array of FIG. 12;
FIGS. 14A-14B show an exemplary biasing of the memory cells of FIG. 13 during reading in a selected and, respectively, in a non-selected sector;
FIGS. 15A-15B show an exemplary biasing of the memory cells of FIG. 13 during erasing in a selected and, respectively, in a non-selected sector;
and
FIGS. 16A-16B show an exemplary biasing of the memory cells of FIG. 13 during programming in a selected and, respectively, in a non-selected sector.

DETAILED DESCRIPTION OF ILLUSTRATIVE EMBODIMENTS

Figure 1:
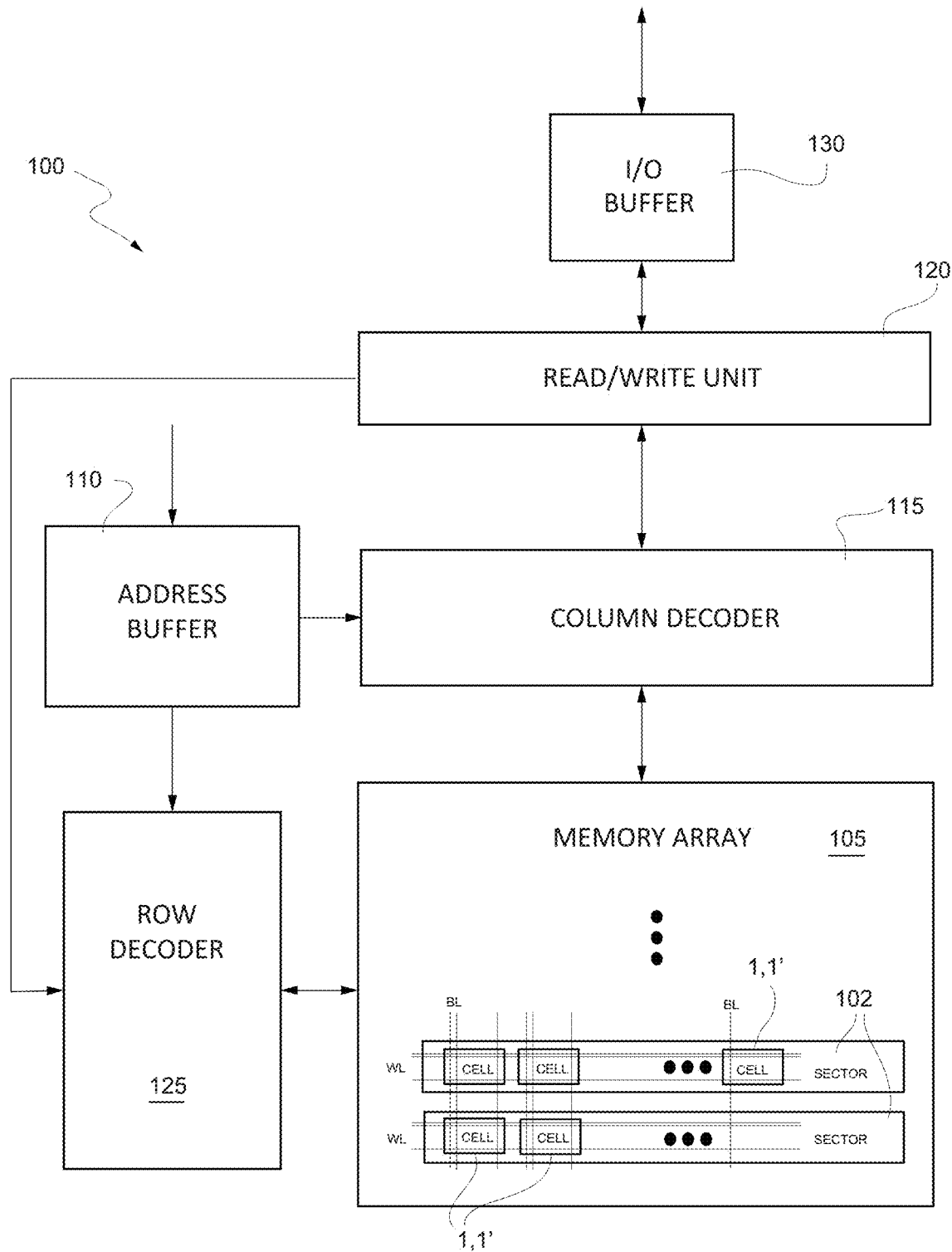
FIG. 1 is a schematic block diagram of a non-volatile memory device.
Figure 2:
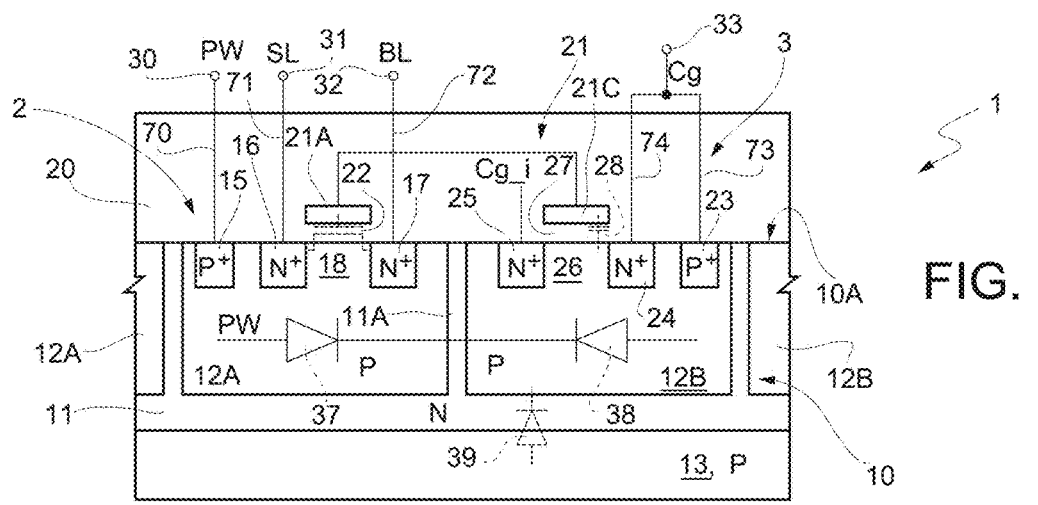
FIG. 2 is a simplified cross-section of an embodiment of a memory cell of the non-volatile memory device of FIG. 1, taken along section line II-II of FIG. 4.
Figure 9:
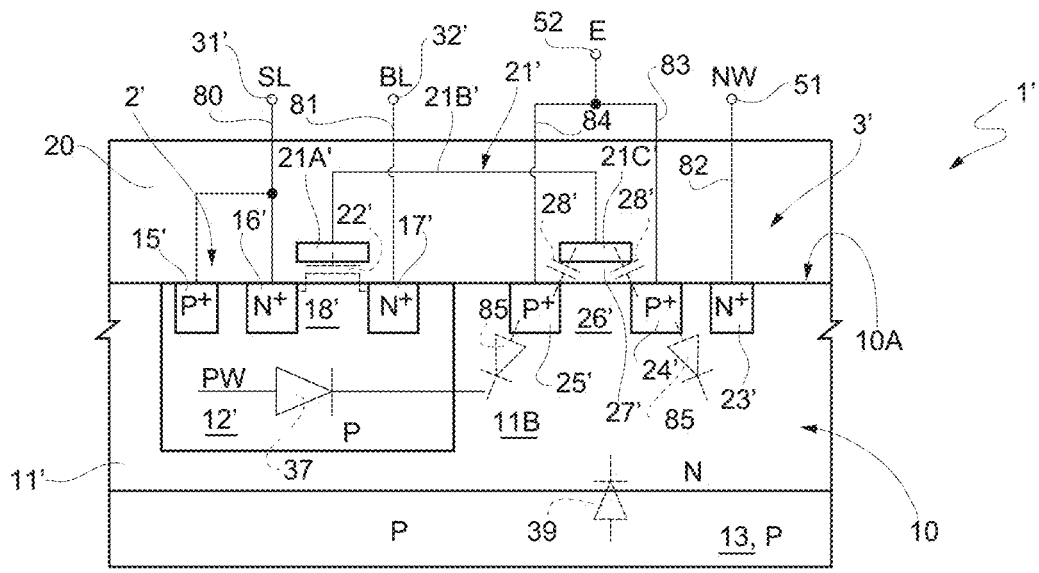
FIG. 9 is a simplified cross-section of another embodiment of a memory cell of the non-volatile memory device of FIG. 1, taken along a section line, analogously to FIG. 2.

FIG. 1 shows a non-volatile memory device 100 of a Cost-Effective or FTP (Few Time Programmable), single poly, floating gate type.
The non-volatile memory device 100 includes a memory array 105, formed by a plurality of memory cells 1, 1' (embodiments whereof are shown in FIGS. 2 and 9) organized in rows and columns and storing each a logic value (for example, one bit).
As described below, each memory cell 1, 1' is based on a floating gate MOS transistor that has a threshold voltage that depends on electric charge stored in its floating gate. Different levels of the threshold voltages represent logic values; here, non-volatile memory device 100 is of single bit type, where the memory cells 1, 1' are programmed (using flash convention, at a logic value "0"; using $E^2$PROM convention, at a logic value "1") when they have a high threshold voltage, and are erased (using flash convention, at a logic value "1"; using $E^2$PROM convention, at a logic value "0") when they have a low threshold voltage.

As also described in detail hereinafter with reference to FIGS. 2-8, in an embodiment, each memory cell 1 may be read and programmed individually and the memory device 100 simultaneously reads and programs selected cells of the memory array 105 (for example, eight memory cells 1). Conversely, in this embodiment, memory cells 1 are erased in groups called sectors, identified by number 102 in FIG. 1; for example, each sector 102 comprises a row of memory cells 1.

In another embodiment, each memory cell 1' may be read and erased individually (although, also here, the memory device 100 may simultaneously read and erase selected cells of the memory array 105, while programming is carried out on an entire sector 102 of memory cells 1', as discussed in detail hereinafter with reference to FIGS. 9-16B.

To allow reading, programming and erasing of the memory cells 1, 1', these are coupled to a column decoder 115 through bit lines BL and to a row decoder 125 through word lines WL. Source lines are also coupled to memory cells 1, 1', although not shown in FIG. 1, for biasing them, as discussed in more detail hereinafter.

An address buffer no receives, from a control unit or an external unit, not shown, an address of a page in the memory array 105 (selected page). The address buffer no provides a portion of the address of the selected page to the row decoder 125, which selects the row of the selected page in the memory array 105 through the word lines WL, and another portion of the address of the selected page to the column decoder 115, which selects one or more columns in the memory array 105 through the bit lines BL. In an embodiment, the address buffer no is also used to select a sector 102 that is to be erased or programmed (through the row decoder 125, as explained hereinbelow).

A read/write unit 120 controls operation of the row decoder 125 and the column decoder 115. The read/write unit 120 also includes some components (such as a power management unit with charge pumps, sense amplifiers, comparators, reference cells, pulse generators, and so on) that are used for writing (i.e., programming or erasing) the memory cells 1, 1' and for reading their logic values, in a per se known manner. The read/write unit 120 is coupled with an input/output (I/O) buffer 13o; the input/output buffer 130 receives a word to be written into the selected page of the memory array 105, or outputs a word that has been read from the selected page of the memory array 105 (through the column decoder 115).

Figure 3:
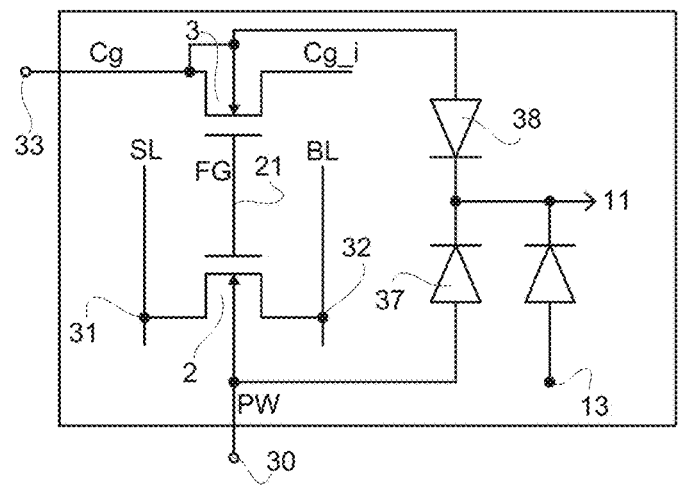
FIG. 3 shows an electric equivalent of the memory cell of FIG. 2.
Figure 4:
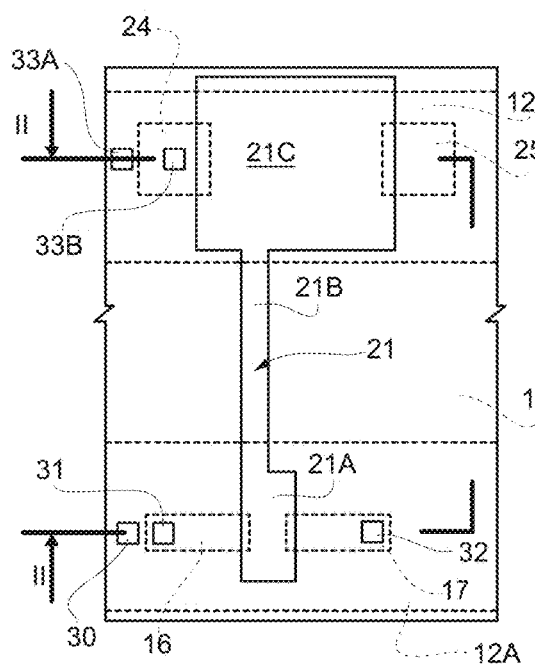
FIG. 4 shows a possible layout of the memory cell of FIG. 2.

FIGS. 2-4 show an embodiment of a portion of the memory array 105 including a memory cell 1.

Memory cell 1 is formed here by a memory MOS transistor 2 and an access MOS transistor 3 formed in separate wells and sharing a floating gate.

In FIGS. 2-4, memory MOS transistor 2 and access MOS transistor 3 are NMOS transistors; in the alternative, they may be PMOS transistors or of opposite type (an NMOS and a PMOS transistor).

Specifically, FIG. 2, memory array 105 is formed in a substrate 10 having a surface 10A and comprising a substrate portion 13, here of P type, and an N-well 11. N-well 11 accommodates a plurality of P-wells, including first P-wells 12A and second P-wells 12B. P-wells 12A, 12B extend here parallel (transverse to the drawing sheet) and are isolated from each other by vertical portions 11A of the N-well 11, also extending transverse to the drawing sheet.

Each first P-well 12A accommodates one or more first well contact regions 15, here of $P^+$ type, a first conduction region 16 and a second conduction region 17 for each memory cell 1. Conduction regions 16, 17, are here of $N^+$ type and extend from the surface 10A of the substrate 10 to the interior of each first P-well 12A. The first and second conduction regions 16, 17 of each memory cell 1 are spaced apart to define a channel portion 18 inbetween.

An insulating layer 20 extend on the surface 10A of the substrate 10 and embeds a plurality of floating gate regions 21 of conductive material, in particular polysilicon. Floating gate regions 21, one for each memory cell 1, have the shape shown in FIG. 4, including a gate portion 21A overlying the channel portion 18; a connection portion 21B (not visible in FIG. 2) and an electrode portion 21C. The portion of the insulating layer 20 under the gate portion 21A of the memory MOS transistor 2 is also called memory gate insulating layer and identified by reference number 22.

Electrode portion 21C extends on the second P-well 12B, as discussed hereinafter; connection portion 21B connects gate portion 21A and electrode portion 21C of the respective floating gate region 21. Portions 21A-21C of the floating gate region 21 are formed by a single connected region, extending, generally planar, in the insulating layer 20 over the surface 10A of the substrate 10 over a respective first P-well 12A, over a respective second P-well 12B and over a respective vertical portion 11A intermediate therebetween.

Second P-well 12B accommodates a second well contact region 23, a first control gate region 24 and a second control gate region 25 for each memory cell 1. Second well contact region 23, first control gate region 24 and second control gate region 25 extend from the surface 10A of the substrate 10 to the interior of second P-well 12B. Second well contact region 23 is here of $P^+$ type, first control gate region 24 and second control gate region 25 are here of $N^+$ type. The first control gate region 24 and the second control gate region 25 of each memory cell 1 are spaced apart and delimit a well portion 26 of the second P-well 12B. Electrode portion 21C of the floating gate region 21 of each memory cell 1 overlies a respective well portion 26. The portion of the insulating layer 20 under the electrode portion 21C of the memory MOS transistor 2 is also called access insulating layer and identified by reference number 27.

Vias extend through the insulating layer 20 in a per se known manner to connect the various regions 15-17 and 23-25 and are represented in FIG. 2 by lines. In particular, the first well contact region 15 is coupled to a well contact 30 through first well via 70 to receive a P-well biasing voltage PW; first conduction region 16 is coupled to a source terminal 31 through first connection via 71 for connection to a source line SL; second conduction region 17 is coupled to a drain terminal 32 through second connection via 72 for connection to a drain line BL; second well contact region 23 and a first control gate region 24 are coupled together and to a gate contact terminal 33 through second well via 73 and control gate via 74, respectively, to receive a control gate voltage Cg; and second control gate region 25 is floating and/or connected to another memory cell 1, as described later. Second control gate region 25 is at gate voltage Cg_i.

The first P-well 12A, the first conduction region 16, the second conduction region 17 and the gate portion 21A of the floating gate region 21 form the memory MOS transistor 2; the second P-well 12B, the second control gate region 25, the first control gate region 24 and the electrode portion 21C form access MOS transistor 3.

Because access MOS transistor 3 has first control gate region 24 and second well contact region 23 coupled to each other, the bulk of access MOS transistor 3 (formed by second P-well 12B including well portion 26) is short-circuited to the first control gate region 24. Therefore, access MOS transistor 3 is not able to operate as a standard MOS transistor but is equivalent to a capacitor, as represented schematically in FIG. 2 by capacitor 28.

FIG. 2 also shows a first parasitic diode 37 formed by first P-well 12A and N-well 11, a second parasitic diode 38 formed by second P-well 12B and N-well 11 and a third parasitic diode 39 formed by substrate portion 13 and N-well 11.

The equivalent electric scheme of the memory cell 1 of FIG. 2 is shown in FIG. 3, representing the floating gate region 21 shared by memory MOS transistor 2 and access MOS transistor 3.

In operation, since access MOS transistor 3 operates as a capacitor, it brings the floating gate region 21 at about the same voltage as the first control gate region 24 (control gate voltage $V_{cg}$) apart from a coupling factor $\alpha_G$. For example, by suitably dimensioning the floating gate region 21 and in particular by suitably selecting the relative dimensions of gate portion 21A and electrode portion 21C as well as the thickness of access insulating layer 27, it possible to have a coupling factor $\alpha_G$ of about 0.8. By applying different voltages to the first control gate region 24, the memory device 100 is able to read, erase and program memory cells 1, while by suitably biasing the bit lines BL and the source lines SL, the memory device 100 is able to select the memory cells 1 to be read/programmed and the sectors 102 to be erased, as explained in detail later with reference to FIG. 5A-5J.

FIG. 4 shows a possible layout of the memory cell 1 and in particular the shape of the floating gate region 21, with portions 21A-21C, and, with dashed lines, the P-wells 12A, 12B, the vertical portion 11A of N-well 11, first conduction region 16, second conduction region 17, first control gate region 24 and second control gate region 25. In addition, FIG. 4 shows also terminals 30, 31, 32, 33A and 33B (wherein contacts 33A, 33B are coupled together by a metal line to form gate contact terminal 33 of FIGS. 2 and 3).

As visible from FIG. 4, the area of electrode portion 21C of floating gate region 21 is quite large, to allow to obtain a high coupling factor $\alpha_G$ and thus a large capacitive coupling between electrode portion 21C and the underlying portion 26 of second P-wells 12.

Memory cell 1 operates as discussed hereinbelow, referring to FIGS. 5A-5J, that use the schematic of FIG. 3 (neglecting the parasitic diodes 37-39).

Reading

Figures 5A, 5B:
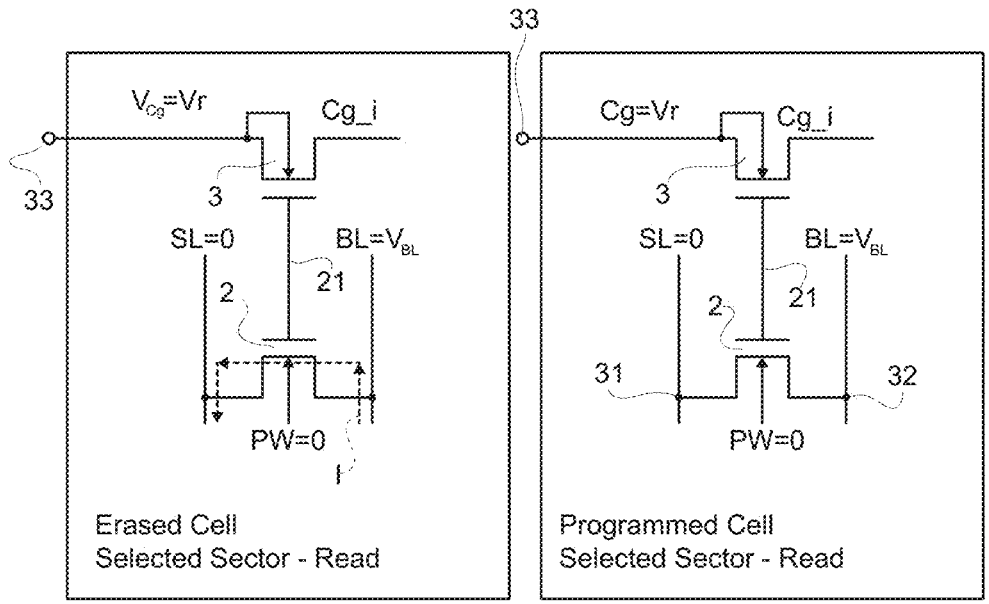
FIGS. 5A-5J show the electric equivalent of the memory cell of FIG. 2 in different operating modes.

FIG. 5A shows a memory cell 1, selected for reading, that has been previously erased. Therefore, memory cell 1 stores a logic value (using flash convention "1"; using E²PROM convention, "0") and has a low threshold voltage.

Reading, as above indicated, is done individually, generally simultaneously with other memory cells 1 belonging to a same page of memory cells 1 (e.g., all the memory cells 1 in the same sector 102, thus the memory cells 1 that have the access MOS transistors 3 in the same second well 12B).

In particular, for reading a selected memory cell 1, the column decoder 115 (FIG. 1) couples the source line SL to ground (V=0 V) and biases the bit line BL to a bit line read voltage VBL (for example VBL=0.6-1 V); in addition, the row decoder 125 (FIG. 1) biases the control gate terminal 33 and the second P-well 12B to a control gate read voltage VCg=Vr (for example Vcg=1.2-1.8 V).

Furthermore, the first P-well 12A (FIG. 2) is biased to low voltage, e.g., to ground voltage (PW=0 V) by Pwell control circuitry, e.g. provided in row decoder 125 (FIG. 1), while the second control gate region 25 is left floating or coupled to an adjacent memory cell 1 in the same sector, as discussed hereinafter.

Access MOS transistor 3, operating as a capacitor, brings the floating gate region 21 at a floating gate reading voltage proportional to the control gate read voltage $V_r$ (e.g., at 0.8 V) because of the capacitive coupling factor $\alpha_G$.

In this condition, the memory cell 1, being erased, is ON and current I flows from the bit line BL toward the source line SL, as shown in dashed line.

This current may be detected by the read/write unit 120 (FIG. 1) in a known manner.

FIG. 5B shows the behaviour of a memory cell 1, selected for reading, that has been previously programmed. Therefore, memory cell 1 stores a logic value (using flash convention logic value "0"; using E²PROM convention, logic value "1") and has a high threshold voltage.

With the same biasing as in FIG. 5A, memory cell 1 is OFF. Thus, no current flows through memory cell 1 and the absence of current may be detected by the read/write unit 120 (FIG. 1).

Figures 5C, 5D:
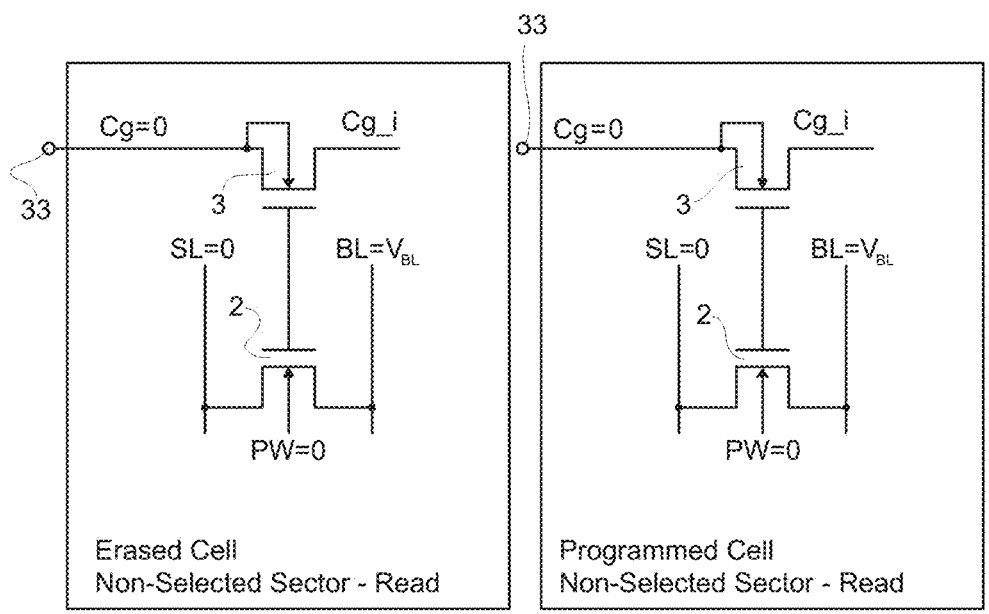

FIG. 5C shows the behaviour of an erased memory cell 1 that is connected to the same bit line as the selected memory cell 1 of FIG. 5A or 5B but belongs to a non-selected sector (non-selected memory cell 1).

In this case, memory cell 1 has grounded source line, (V=0 V), bit line BL biased to the bit line read voltage VBL but grounded control gate terminal 33 ($V_{Cg}$=0 V). The first P-well 12A (FIG. 2) is grounded (PW=0 V).

The floating gate 21, capacitively coupled to the control gate terminal 33, is also grounded; therefore the memory cell 1 is OFF and no current flows therethrough.

As an alternative to the biasing shown in FIG. 5C, if there is the risk of having depleted memory cells 1 (ultra-erased cells, with negative threshold), a negative voltage may be applied to the control gate terminal 33 of non-selected sectors 102.

Analogously, FIG. 5D, in case of a programmed memory cell 1 belonging to a non-selected sector and connected to the same bit line as the selected memory cell 1 of FIG. 5A or 5B, due to the zero voltage at the control gate terminal 33 of the memory cell of FIG. 5D and its high threshold, no current flows.

Summarizing, reading is done by applying a first biasing voltage to the first conduction region 16, a second biasing voltage to the second conduction region 17 and applying a read voltage to the first control gate region 24, and detecting whether a current flows between the first and second conduction regions 16, 17 through the channel portion 18.

Programming

Figures 5E, 5F:
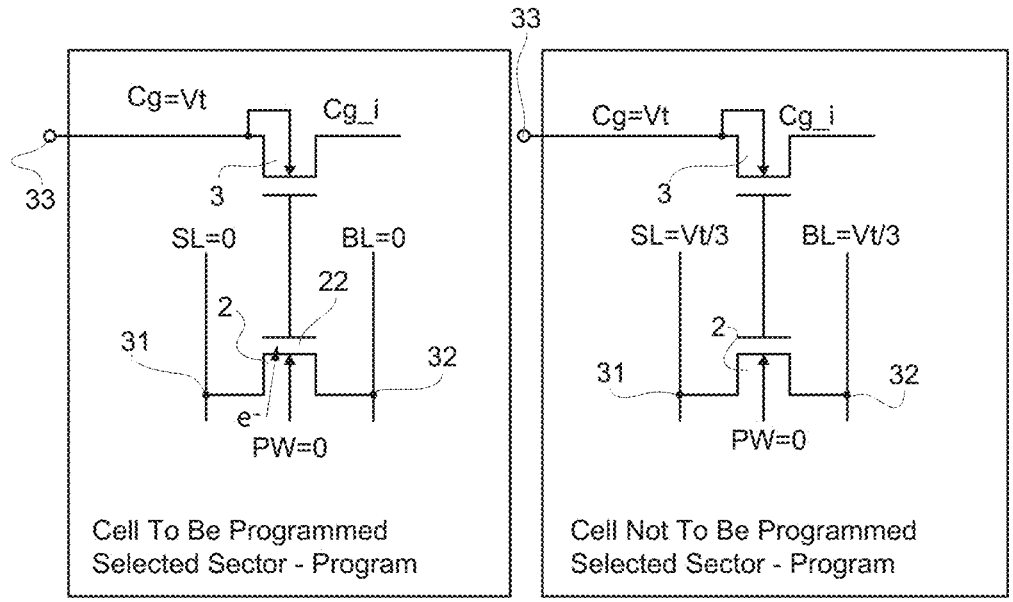

FIG. 5E shows the behaviour of a memory cell 1, selected to be programmed, in a selected sector. Programming is done here using the Fowler-Nordheim effect, by applying a high tunnel voltage between the floating gate 21 and the conduction regions 16, 17 (FIG. 2) of the memory MOS transistor 2 thereby causing injection of electric charges through the memory gate insulating layer 22.

Here, the source line SL and the bit line BL are grounded ($V_{BL}=V_{SL}=0$ V) through a program path in the column decoder 115 and the control gate terminal 33 is biased at a tunneling voltage $V_{Cg}=V_t$ (for example $V_t$=15-16 V). The first P-well 12A is grounded (PW=0 V).

By virtue of the coupling between the floating gate 21 and the first control gate region 24 (FIG. 2), the floating gate 21 is at about the same control gate program voltage $V_{Cg}$ at the gate contact terminal 33, except for the coupling factor $\alpha_G$ (for example, the voltage at the floating gate region 21 may be about 12-13 V), causing injection of electrons e⁻ in the floating gate region 21 by tunnelling.

FIG. 5F shows the behaviour of a memory cell 1, not selected to be programmed, belonging to a selected sector 102.

Since the memory cell 1 of FIG. 5F is in a selected sector 102, its control gate terminal 33 is biased at tunneling voltage $V_{Cg}=V_t$, but its source and drain terminals 31, 32 receive program inhibit voltages, lower than tunnelling voltage $V_t$, through the program path in the column decoder 115 for example, $V_{BL}=V_{SL}=\frac{1}{3}V_t$.

Therefore, the voltage drop between the floating gate 21 and the conduction regions 16, 17 (FIG. 2) of the memory MOS transistor 2 (less than $\frac{2}{3}V_t$, e.g., 7-8 V) is not sufficient to cause charge injection, and the memory cell 1 of FIG. 5F is not programmed.

Figures 5G, 5H:
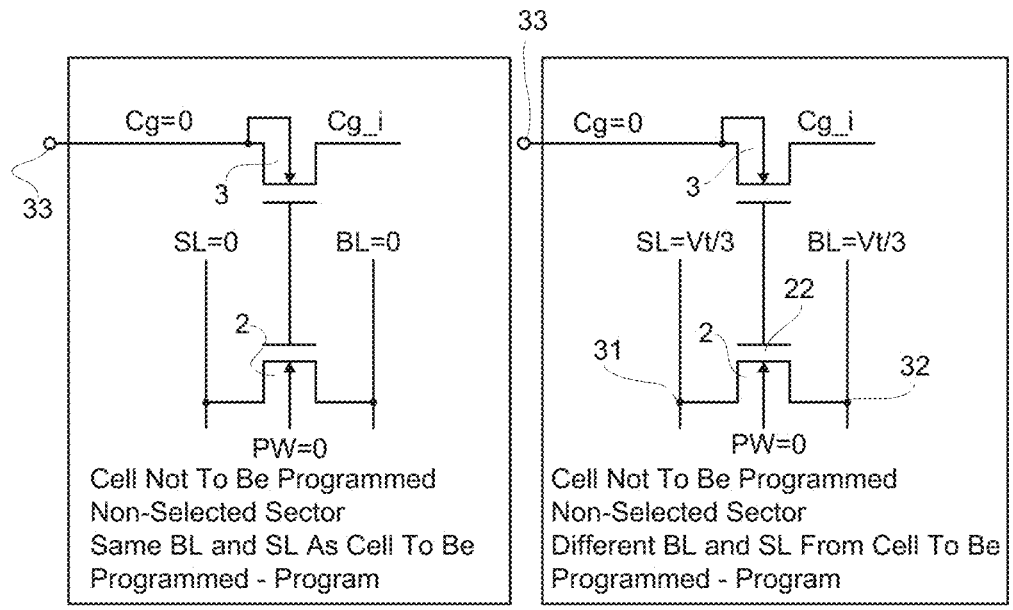

FIG. 5G shows the behaviour of a memory cell 1, not selected to be programmed, in a not selected sector 102, but connected to the same bit line BL (and to the same source line SL) as the selected memory 1 of FIG. 5E.

Therefore, memory cell 1 of FIG. 5G has grounded source and bit lines SL, BL ($V_{BL}=V_{SL}=0$ V); however, control gate terminal 33 is here grounded. Therefore, non-selected memory cell 1 of FIG. 5G is not programmed.

The non-selected memory cell 1 in a non-selected sector 102 of FIG. 5H has control gate terminal 33 grounded and source and drain terminals 31 and 33 biased at the program inhibit voltage, here $V_{BL}=V_{SL}=\frac{1}{3}V_t$.

The voltage drop across the memory gate insulating layer 22 is thus less than $\frac{1}{3}V_t$ and non-selected memory cell 1 of FIG. 5H is not programmed.

Summarizing, programming is done by applying a first voltage to the first control gate region 24 and a second voltage to the first P-well 12A, the first and second voltages generating a voltage drop between the gate portion 21A of the floating gate region 21 and the first P-well 12A and causing first electrical charges to flow from the first P-well 12A into the gate portion 21A of the floating gate region 21 by Fowler-Nordheim tunnelling.

The first voltage is higher than the second voltage and the electrical charges are electrons.

Erasing

Figures 5I, 5J:
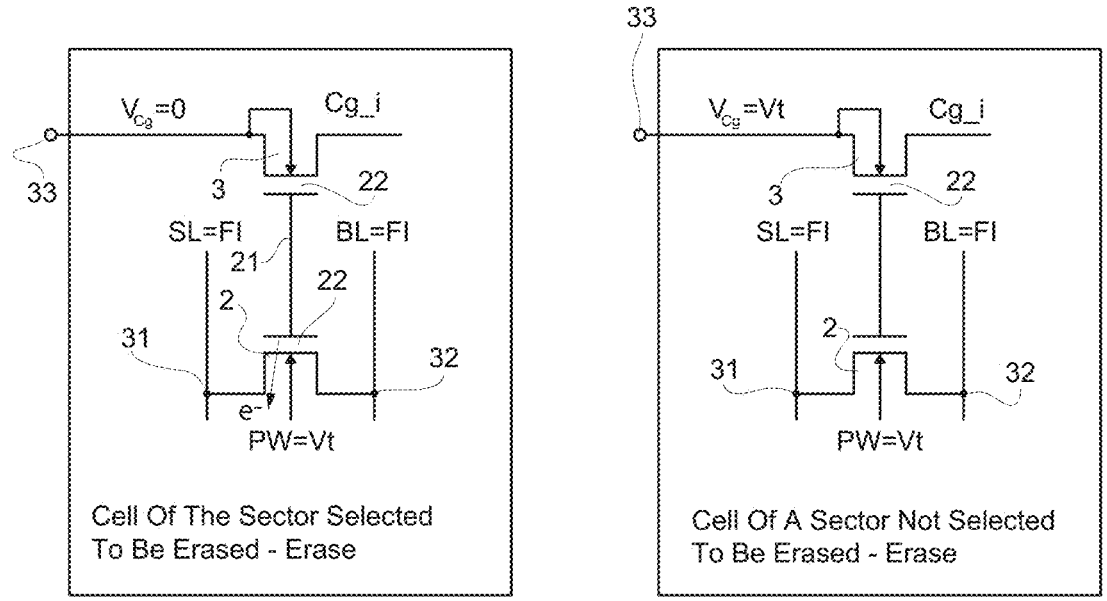

FIG. 5I shows the behaviour of a memory cell 1, belonging to a sector 102 selected to be erased. As indicated above, erase is done here at sector level, for all the memory cells 1 belonging to a selected sector 102 (sharing the same first P-well 12A of FIG. 2). In this embodiment, erase also exploits the Fowler-Nordheim effect, and is done by applying a high inverse tunnel voltage between the floating gate 21 and the first P-well 12A (FIG. 2), thereby causing extraction of electric charges from the floating gate region 21 through the memory gate insulating layer 22.

In FIG. 5I, the source line SL and the bit line BL are floating and control gate terminal 33 is grounded ($V_{Cg}=0$ V).

Also here, by virtue of the coupling between the floating gate 21 and the first control gate region 24 (FIG. 2), the floating gate 21 is about at ground voltage and about the entire tunneling voltage $V_t$ is applied to the memory gate insulating layer 22, causing extraction of electrons $e^-$ from the floating gate region 21 by tunnelling and thus erasing of the selected memory cell 1.

FIG. 5J shows the behaviour of a memory cell 1, belonging to a non-selected sector 102 and thus not selected to be erased, connected to the same source line SL and same bit line BL as the selected memory cell 1 of FIG. 5I. Thus, memory cell 1 of FIG. 5J has floating source line SL and floating bit line BL.

In addition, the control gate terminal 33 and the first P-well 12A are both coupled to tunneling voltage $V_t$ ($V_{Cg}=PW=V_t$).

Since, in the memory cell 1 of FIG. 5J, the floating gate 21 and the underlying first P-well 12A are at about the same high tunneling voltage $V_t$, the memory cell 1 of FIG. 5J is not erased, and its memory gate insulating layer 22 is not stressed, thereby avoiding any disturb.

The same biasing is applied to all the memory cells 1 of the memory device 100 that do not belong to the selected sector 102.

Therefore, during erasing, all bit lines BL and all source lines SL are left floating and all P-wells 12A are biased at the tunneling voltage $V_t$; the selected sector(s) 102 have grounded control gate terminal 33, while the non-selected sector have control gate terminal 33 biased at the tunneling voltage $V_t$.

The above reading, programming and erasing biasing may be applied to different architectures of the memory array 105 of FIG. 1, encompassing the memory cell 1 of FIGS. 2-4, a discussed hereinbelow.

Figure 6:
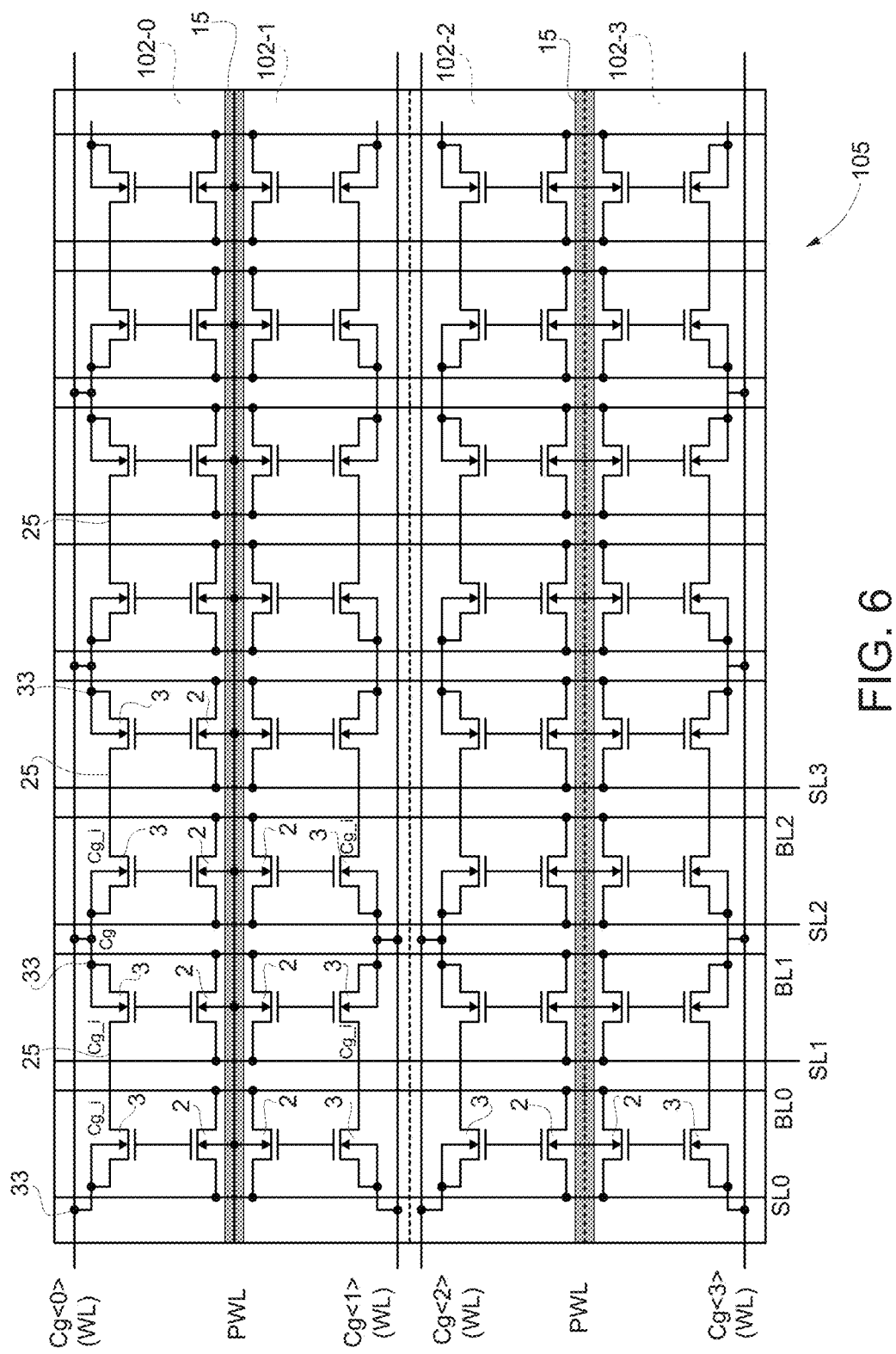
FIG. 6 shows an architecture of a memory array formed by the memory cells of FIG. 2, according to an embodiment.

FIG. 6 shows a possible architecture of the memory array 105 formed of memory cells 1 of FIGS. 2-5I.

In FIG. 6, four sectors 102 are shown, identified by 102-0 to 102-3.

In an embodiment, each sector 102 is formed in two own separate P-wells 12A, 12B, as shown in the cross-section of FIG. 2, and a plurality of vertical portions 11A (FIG. 2) of the N-well 11 separate not only the first and second P-wells 12A, 12B of each sector 102, but also adjacent sectors 102. In this case, a row of memory MOS transistors 2 in a sector 102 may be arranged between a row of access MOS transistors 3 of the same sector 102 and a row of access MOS transistors 3 of an adjacent sector 102 and vice versa.

In the alternative, as shown in FIG. 6, a row of memory transistors 2 in a sector 102 (e.g., sector 102-1) may be arranged between a row of access MOS transistors 3 of the same sector 102 (here sector 102-1) and a row of memory transistors 2 of an adjacent sector 102 (here, sector 102-0).

In addition, with the rows of memory MOS transistors 2 and access MOS transistors 3 arranged as shown in FIG. 6, a single first P-well 12A (not represented in FIG. 6 for clarity) may accommodate the rows of memory MOS transistors 2 of two adjacent sectors 102 (for example, the memory MOS transistors 2 of sectors 102-0 and 102-1). In this way, a single metal well biasing line (indicated by PWL in FIG. 6) for the first P-wells 12A of two adjacent sectors 102 and thus less well contacts 30 (and respective first well contact regions 15) may be provided, e.g., a single well contact 30 may be provided every two adjacent memory MOS transistors 2 of adjacent sectors 102.

In addition, the columns of memory cells 1 (meaning the groups of memory cells 1 that are aligned in the column direction and share the same bit lines BL and the same source lines SL) may have source and bit lines SL, BL arranged as depicted in FIG. 6 (here the source lines SL on the left and the bit lines on the right of each column of memory cells 1). In the alternative, two bit lines BL of two adjacent columns of memory cells 1 may be arranged close to each other, and two source lines SL of two adjacent columns of memory cells 1 may be arranged near to each other, to simplify the column decoder.

FIG. 6 also shows the mutual connection of the connection gate regions 25 of adjacent access MOS transistors 3 of a same sector 102 (e.g., sector 102-0, obtained for example by having a single second control gate region 25 shared by two adjacent memory cells 1 in the same sector 102).

In addition, FIG. 6 shows the mutual connection of the gate contact terminals 33 of access MOS transistors 3 of a same sector 102; this arrangement may be obtained through metal word lines WL connecting gate contact terminals 33.

Figure 7:
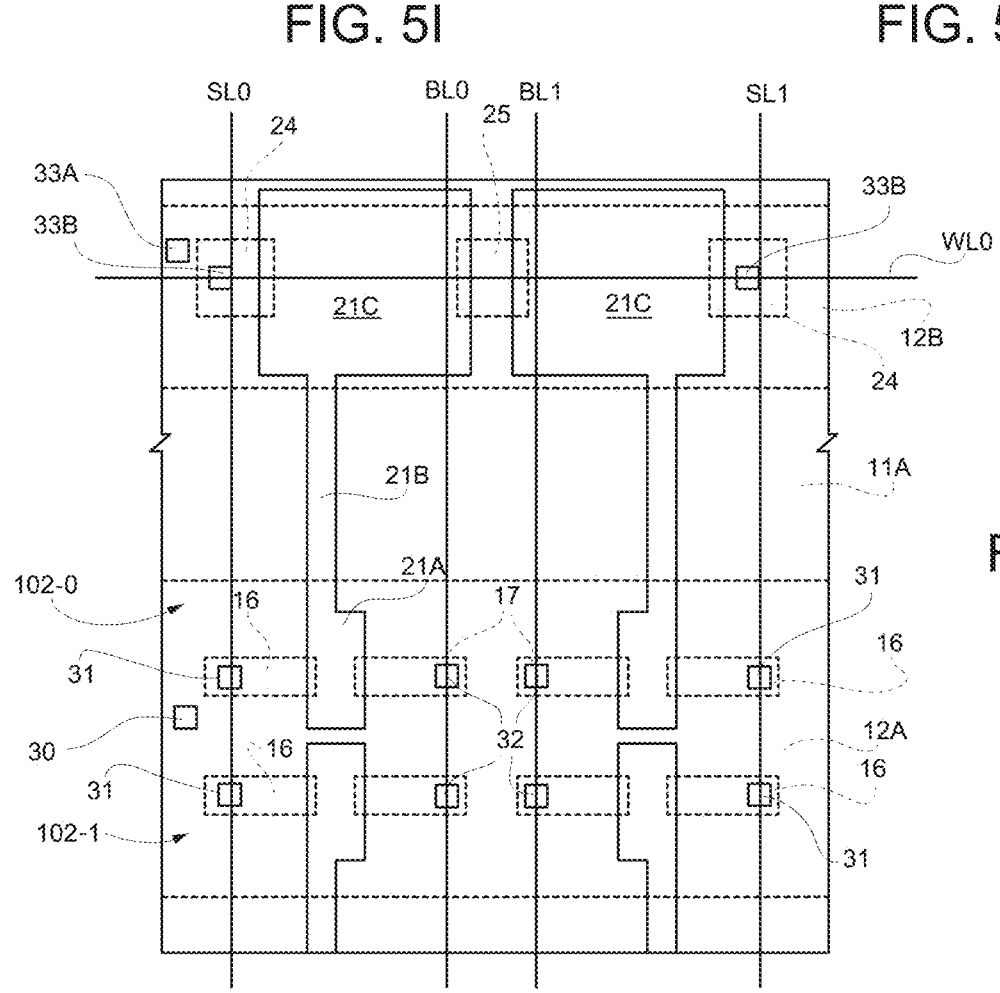
FIG. 7 shows a possible layout of two adjacent memory cells of the memory array of FIG. 6.

FIG. 7 shows a possible layout and mutual arrangement of adjacent memory cells 1 of the memory array 105 of FIG. 6.

Here, the first P-well 12A is shared by adjacent memory MOS transistors 2 of two adjacent sectors (here, 102-0 and 102-1).

In FIG. 7, two source lines SL0 and SL1, two bit lines BL0 and BL1 and a word line W00 have also been schematically shown.

Figure 8:
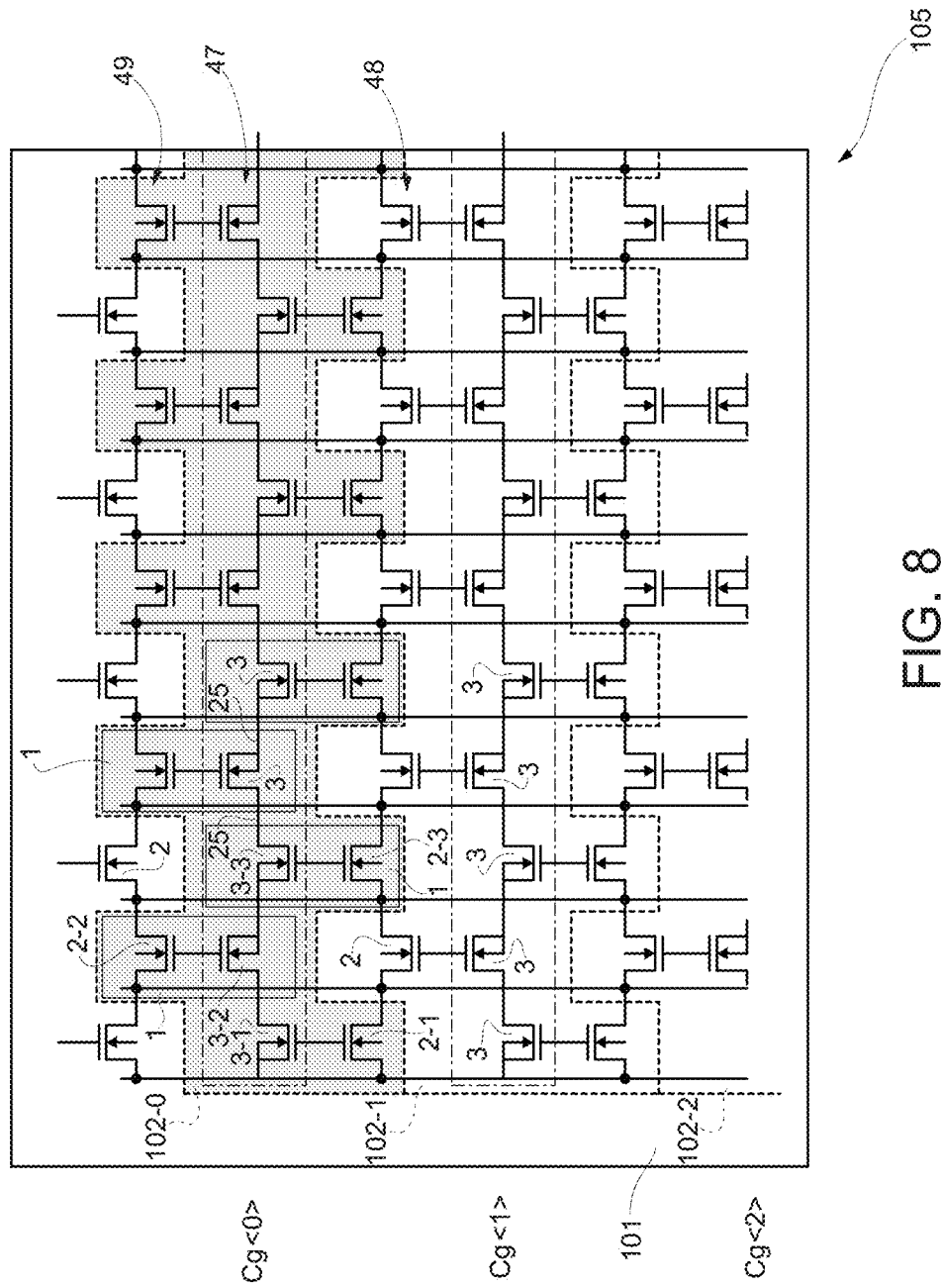
FIG. 8 shows another architecture of the memory array formed by the memory cells of FIG. 2, according to another embodiment.

FIG. 8 shows a different architecture of the memory array 105.

Here, in the row direction, pairs of access MOS transistors 3 (coupled at the respective connection gate regions 25) belong to different sectors 102 and are coupled to non-adjacent memory MOS transistors 2. For example, the access MOS transistor 3 on the left end of sector 102-0 (identified in FIG. 8 by 3-1 and belonging to an access MOS transistor row 47) is coupled to memory MOS transistor (identified by 2-1) belonging to a lower memory MOS transistor row 48; a following access MOS transistor 3-2 in the same access MOS transistor row 47 is coupled to a memory MOS transistors 2-2 belonging to an upper memory MOS transistor row 49; the third access MOS transistor 3-3 in the same access MOS transistor row 47 is coupled to the third memory MOS transistor 2-3 belonging to lower memory MOS transistor row 48, and so on.

Therefore, adjacent memory MOS transistors 2 in a same memory MOS transistor row belong to different sectors 102.

With this solution, adjacent memory MOS transistors 2 are better decoupled during reading, programming and erasing; but a negative voltage may be applied to the control gate terminal 33 of non-selected sectors in case of depleted memory MOS transistors 2.

FIG. 9 shows a different embodiment of a memory cell of the memory array 105 of FIG. 1, indicated by 1'.

Memory cell 1' has a general structure similar to memory cell 1 of FIGS. 2-4; therefore features that are common to memory cells 1 and 1' are designated by the same reference number and are described shortly hereinbelow; features that are similar are indicated with an apex for memory cells 1' and described more in detail.

Memory cell 1' of FIG. 9 is formed by a memory MOS transistor 2' and an access MOS transistor 3' sharing floating gate region 21'.

Memory MOS transistor 2' is here an NMOS transistor and is formed in an own P-well 12'; access MOS transistor 3' is here a PMOS transistor and formed in N-well 11' extending adjacent to P-well 12' in a direction perpendicular to the drawing sheet.

In a different embodiment, memory MOS transistor 2' and access MOS transistor 3' may be of inverted type or both of a same type (either NMOS or PMOS), although the specific implementation shown in FIG. 9 simplifies the manufacture, in particular as regards isolation and possible current leakages, as discussed below.

P-well 12' accommodates also here one or more first well contact regions 15', here of P$^+$ type, for each P-well 12'; in addition P-well 12' accommodates a first conduction region 16' and a second conduction region 17', here of N$^+$ type, for each memory cell 1'.

Figure 11:
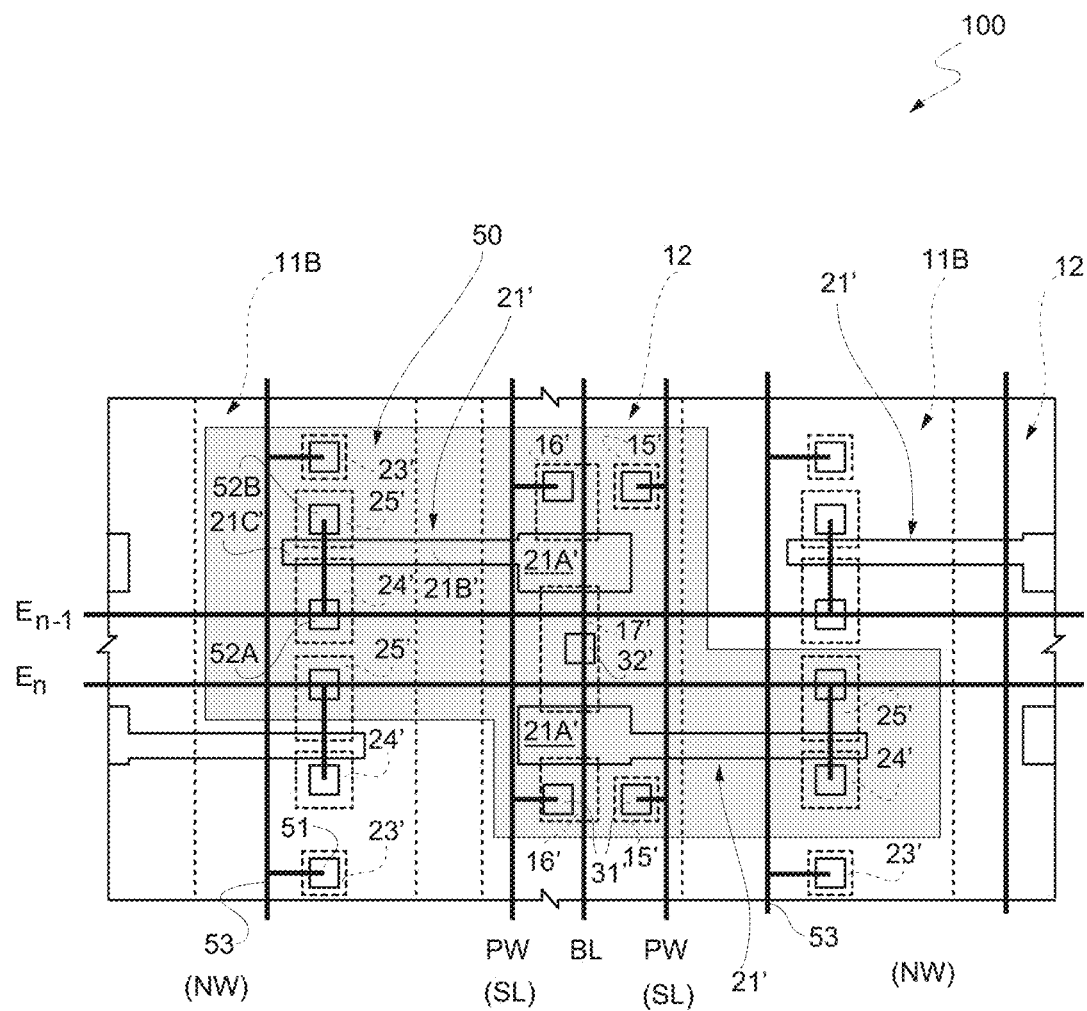

Also here, floating gate region 21' extend in insulating layer 20 over substrate 10 and has the shape shown in FIG. 11, including a gate portion 21A', overlying the channel portion 18' and insulated therefrom by memory gate insulating layer 22'; a connection portion 21B' (FIG. 11) and an electrode portion 21C', overlying well portion 26' and insulated therefrom by the access insulating layer 27'. Also here, gate portion 21A', connection portion 21B', and electrode portion 21C' are formed by a single connected region, generally planar.

N-well portion 11B accommodates a second well contact region 23', a first control gate region 24' and a second control gate region 25'. Second well contact region 23' is here of N$^+$ type, first and second control gate regions 24', 25' are here of P$^+$ type.

Vias (shown only schematically) extend through the insulating layer 20 in a per se known manner to connect the various regions 15'-17' and 23'-25'.

In particular, here, the first well contact region 15' and first conduction region 16' are coupled together (e.g., through a silicide region, not shown, extending on the surface 10A of substrate 10) and to a source contact 31' through a P-well via 8o to receive a source biasing voltage SL (that is also the biasing voltage of P-well 12').

Second conduction region 17' is coupled to a drain terminal 32' through a bitline via 81 for connection to drain line BL.

Second well contact region 23' is coupled to an N-well biasing terminal 51 through an N-well via 82.

First and second control gate regions 24', 25' are coupled together and to a gate terminal 52 through a respective first and second control via 83, 84 to receive a control gate voltage E.

The first conduction region 16', the second conduction region 17' and the gate portion 21A' of the floating gate region 21 form memory MOS transistor 2'; the first and the second control gate regions 24', 25' and the electrode portion 21C' form access MOS transistor 3'.

Also here, by virtue of the connection of control gate regions 24 and 25', access MOS transistor 3' does not operate as a standard MOS transistor but is equivalent to capacitors 28'. In addition, here, also the capacitive coupling between floating gate region 21' and the underlying portions of the substrate 10, including the P-well 12', the first conduction regions 16' and the second conduction regions 17' under gate portion 21A' and N-well portion 11B under electrode portion 21C', play an important role in the operation of the memory cell 1', as discussed in detail hereinbelow, although the corresponding equivalent capacitors have not been shown.

In addition, FIG. 9 also shows two parasitic diodes 85 formed between first and second control gate regions 24', 25' and N-well portion 11B.

Figure 10:
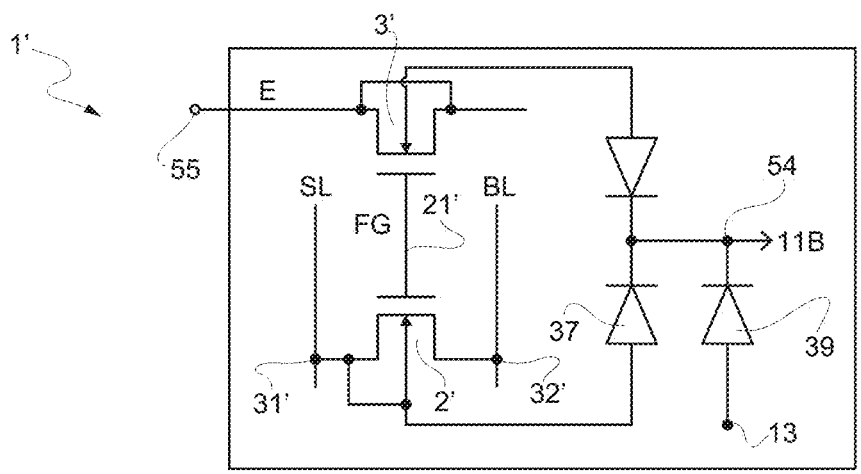
FIG. 10 shows an electric equivalent of the memory cell of FIG. 9;
FIG. ii shows a possible layout of the memory cell of FIG. 9.

The equivalent electric scheme of the memory cell 1' of FIG. 9 is shown in FIG. 10, representing the floating gate region 21' shared by memory MOS transistor 2' and access MOS transistor 3' as well as parasitic diodes 37 and 39.

In operation, due to the capacitive coupling between the floating gate region 21' and the substrate 10, the areas thereof and the specific biasing discussed below, the floating gate region 21' is at a potential near the potential of channel portion 18' of memory MOS transistor 2', apart from a coupling factor $\alpha_G$, except for reading, when it is at an intermediate potential, as discussed below.

In the embodiment of FIG. 9, by applying different voltages to the control gate regions 24', 25' and to the first and second conduction regions 16', 17', memory cell 1' may be selected during reading, erasing and programming operations, although through different mechanisms and using different physical effect from the those described above, as explained in detail later with reference to FIG. 13-18B.

FIG. 11 shows a possible layout of a base element 50 formed by two twin cells 1'.

As visible, in the memory cell 1', gate portion 21A' of floating gate region 21 is here larger than electrode portion 21C'. Thus, here, the capacitive coupling between the substrate 10 and the floating gate region 21' is greater at the read MOS transistor 2' than at MOS access 3' and the floating gate region 21' tends to be at a voltage that is nearer to the potential(s) of the P-well 12A and of the first conduction regions 16', second conduction regions 17' than to the potential(s) of the N-well portion 11B, first and second control gate regions 24', 25', as discussed hereinbelow.

FIG. 11 also shows, with dashed lines, P-wells 12', N-well portions 11B, first conduction regions 16', second conduction regions 17' (here common to the twin cells 1'), first and second control gate regions 24', 25', first well contact regions 15' and second well contact regions 23'.

In addition, FIG. 11 shows also terminals 31', 32', 51 and 52A and 52B (wherein terminals 52A, 52B are coupled together by a metal line to form gate terminal 52 of FIGS. 9 and 10, as above indicated).

N-well biasing lines 53 (metal lines) are shown only schematically and bias second well contact regions 23' to N-well biasing voltage NW. Here, word lines En-1, En are shown.

Figure 12:
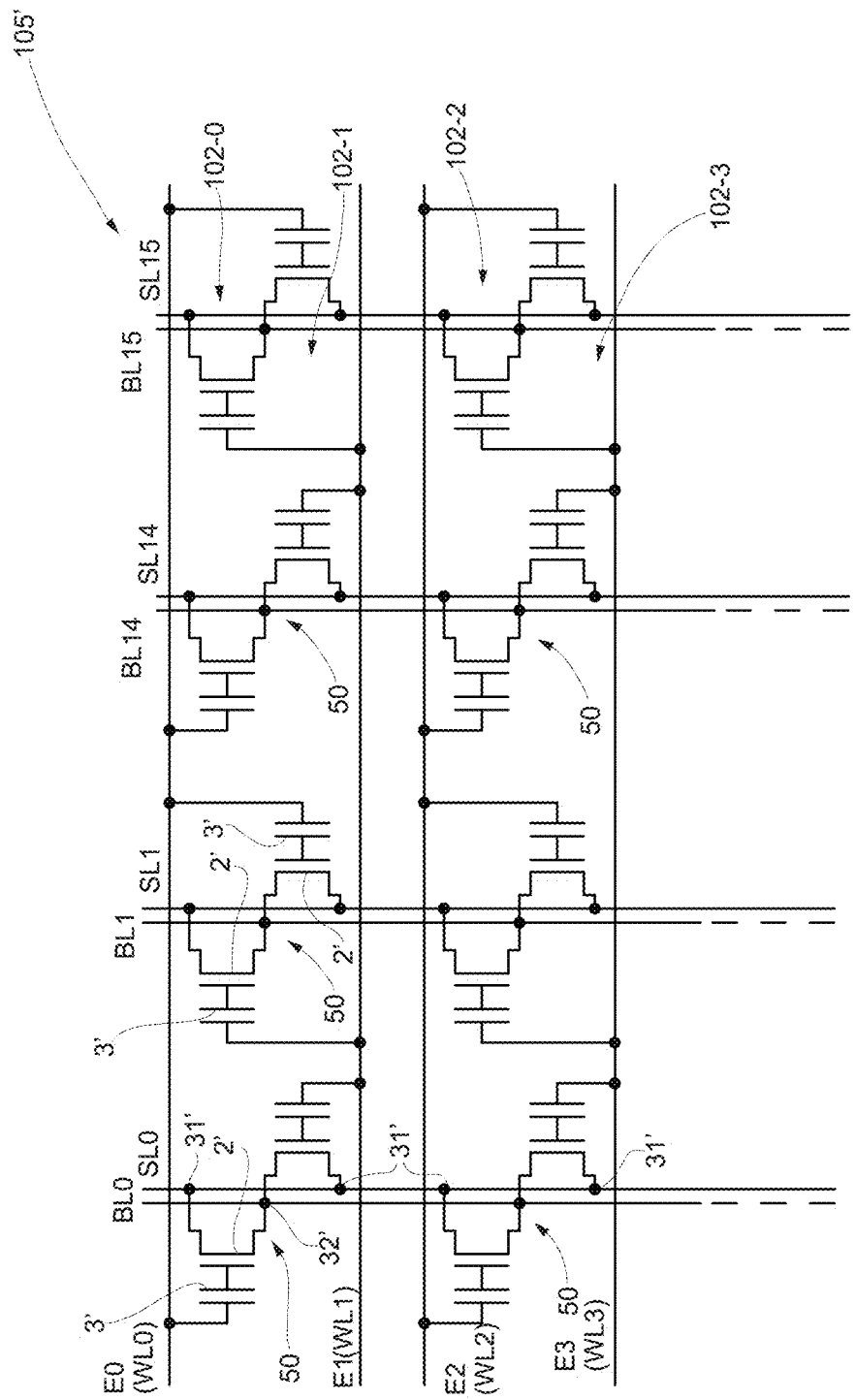
FIG. 12 shows an architecture of a memory array formed by the memory cells of FIG. 9, according to an embodiment.

FIG. 12 shows an electrical equivalent of a possible architecture of a cluster 106 of memory array 105 formed of memory cells 1' of FIGS. 9-10.

In general, a cluster 106 comprises a plurality of sectors; for example, for a word size of 32 bit, 32 sectors 102' may be provided. In FIG. 12, four sectors 102' are shown, identified by 102-0, 102-1, 102-2 and 102-3. Also, each sector 102' comprises a plurality of memory cells 1', at least eight memory cells 1' (eight bits), here sixteen memory cells 1' (only four shown).

As visible, the access MOS transistors 3' of each base element 50 are coupled to different word lines WL (here, WL0-WL3) and receive different control gate voltages E (here, E0-E3); they have a common drain terminal 32' coupled to a common bit line among bit lines BL0-BL9 and source terminals 31 coupled to a same source line among source lines Sl0-Sl9.

Operation of memory array 105 of FIG. 12 will be described hereinbelow using the representation of FIGS. 12 and 13, wherein programming (the operation of injecting electric charges into the floating gate region 21') is here made using the Band to Band Hot Electron (BBHE) effect and is a non-selective operation (therefore, it is applied to all memory cells 1' of one or more selected sectors 102') and erasing (the operation of extracting electric charges from the floating gate region 21') is made using the Fowler-Nordheim effect and is a selective operation (therefore, it is applied to one or more selected memory cells 1' of one or more selected sectors 102').

FIG. 13 shows two adjacent base element 50 of a sector 102' in a simplified cross-section representing the first conduction region 16', the second conduction region 17', the P-well 12 and the first well contact region 15' of the memory MOS transistor 2' as well as the first and second control gate regions 24', 25', N-well portion 11B and the second well contact region 23' of the access MOS transistor 3' aligned to each other. In addition, for highlighting the continuity between each gate portion 21A' and a respective electrode portion 21C', floating gate regions 21' are shown as rectangles extending from above channel portion 18' of memory MOS transistor 2' to well portion 26' of capacitor transistor 3'.

Parasitic diodes 37 and 39, the capacitors 28' and parasitic diodes 85 have not been represented in FIG. 13. In fact, as regards parasitic diodes 37 and 39, N-well 11 is always biased so that parasitic diodes 37 and 39 are reverse biased in any operation mode of the memory array 105, as discussed below, and thus surely off. Thereby, electrical isolation between P-well 12' and N-well 11 as well as between N-well 11 and substrate portion 13 is obtained. Vice versa, capacitors 28' and parasitic diodes 85 actively participate to the modification operations of the memory array 105, as discussed in detail below.

In particular, FIG. 13 shows two adjacent base elements 50-1 and 50-2, coupled to two different word lines WL (and receiving respective control gate voltages E0 and E1), to two different bit lines BL0 and BL1 and two different source lines PW0 and PW1. The N-well portion 11B is coupled to voltage NW.

Specifically, base element 50-1 comprises memory cells 60-1 and 60-2 and base element 50-2 comprises memory cells 60-3 and 60-4. Memory cells 60-2 and 60-3 are coupled to word line WL0, memory cells 60-1 and 60-4 are coupled to word line WL1; memory cells 60-1 and 60-2 are coupled to bit line BL0 and source line PW0, and memory cells 60-3 and 60-4 are coupled to bit line BL1 and source line PW1.

Sectors 102-1 and sector 102-2 belong to a same cluster 106 and thus are coupled to a same N-well biasing line 53 to receive the same N-well biasing voltage NW.

Memory cells 60-n of FIG. 13 operate as discussed hereinbelow, referring to FIGS. 14A-14B for reading, FIGS. 15A-15B for erasing and FIGS. 16A-16B for programming. The numbering of sectors 102-0 to 102-3 is the same of FIG. 12.

Reading

Reading is also here done individually, possibly simultaneously with other selected memory cells 1' (not shown).

FIG. 14A shows the biasing applied in case of selecting memory cell 60-2 (also called selected memory cell 60-2), coupled to bit line BL0 (also called selected bit line BL0), source line SL0 (also called selected source line SL0) and word line E0 (also called selected word line E0). Here, selected memory cell 60-2 is supposed to be have been previously erased and thus storing a logic value (using flash convention logic value "1"; using E²PROM convention, logic value "o").

Selected memory cell 60-2 is in the same sector (selected sector 102-0) with non-selected memory cell 60-3 (coupled to the selected word line E0), while memory cell 60-1 (belonging to the same selected basic unit 50-1 of the selected memory cell 60-2) and memory cell 60-4 (belonging to the same basic unit 50-2 of non-selected memory cell 60-3) are non-selected. Non-selected memory cell 60-1 is coupled to selected bit line BL0, selected source line SL0 and non-selected word line E1. Non-selected memory cell 60-3 is coupled to non-selected bit line BL1, non-selected source line SL1 and selected word line E0, and memory cell 60-4 is coupled to non-selected bit line BL1, non-selected source line SL1 and non-selected word line E1.

FIG. 14B shows the biasing applied to memory cells 60-i, 60-i+1 and 60-j belonging to non-selected sectors 102-2 and 102-3 (coupled to non-selected word lines WL2 and WL3), wherein memory cells 60-i and 60-i+1 are coupled to selected bit line BL0 and selected source line SL0.

With reference to FIG. 14A, for reading selected memory cell 60-2, the column decoder 115 (FIG. 1) couples selected source line $PW_0$ to a P-well read voltage, e.g., ground (PW0=0 V) and biases selected bit line BL0 to a bit line read voltage BL0 (for example 1 V); in addition, the row decoder 125 (FIG. 1) biases the first and the second control gate regions 24', 25' (as well as the second well contact region 23') to a control gate read voltage E0 (for example 1.8 V).

In addition, non-selected source line SL1 and non-selected bit line BL1 (both coupled to non-selected basic unit 50-2 of FIG. 12) are grounded (PW1=BL1=0 V); non-selected word lines E1, E2, E3 are also grounded.

N-well biasing voltage NW is set at a N-well read value, e.g., at 1.8 V, thereby reverse biasing parasitic diode 37 (FIG. 9) which is thus maintained always off.

Here, due to the capacitive coupling of the floating gate region 21' with the facing portions of the substrate 10 and the selected biasing (NW=E0=1.8 V, BL0=1 V, PW0=0 V), the floating gate region 21' of the selected memory cell 60-2 is brought to an intermediate voltage, the N-well and control gate read value E0 and control gate read biasing voltage BL0 (e.g., at about 0.6 V).

In this condition, the selected memory cell 60-2, having a low threshold voltage, is ON and current I flows from the bit line BL1, through the second conduction region 17', the channel region 18', the first conduction region 16' toward the source line SL1, as shown by an arrow 55.

This current may be detected by the read/write unit 120 (FIG. 1) in a known manner, to read a bit having a predetermined logic value (using flash convention, logic value "1", using E²PROM convention, logic value "0").

Of course, if selected memory cell 60-2 were programmed, and thus had a high threshold, no current would flow and the read/write unit 120 (FIG. 1) would read a bit having logic value, using flash convention, "o" (using E²PROM convention, "1").

Non-selected memory cell 60-1 of the selected basic unit 50-1 (thus, having memory MOS transistor 2' in the same P-well 12' of selected memory cell 60-2, but coupled to non-selected word line E1) is off.

Non-selected memory cell 60-3, coupled to selected word line E0, to non-selected source line SL1 and non-selected bit line BL1, does not conduct any current.

Non-selected memory cell 60-4 in the non-selected sector 102-1 and non-selected memory cells 60-i and 60-j in the non-selected sectors 102-2, 102-3 are all off, being coupled to non-selected word lines E1, E2 and E3 that are grounded, although non-selected memory cells 60-i and 60-i+1 are coupled to selected bit line BL0.

Summarizing, reading is done by applying a first biasing voltage to the first conduction region 16', a second biasing voltage to the second conduction region 17' and applying a read voltage to the first control gate region 24' of a selected memory cell 1', and detecting whether a current flows between the first and second conduction regions 16', 17' through the channel portion 18'.

Erasing

As indicated above, in this embodiment, erasing is a selective operation and is performed by exploiting the Fowler-Nordheim effect.

FIGS. 15A and 15B show the behaviour of memory cells 60-1 to 60-4, 60-i, 60-i+1 and 60-j of FIG. 13 when memory cell 60-2 is selected to be erased.

Thus, also here, sector 102-0 in FIG. 15A is the selected sector, and sectors 102-1 in FIG. 15A and 102-2, 102-3 in FIG. 15B are non-selected sectors; the source line SL0, bit line BL0 and word line WL0 coupled to the selected memory cell 60-2 are indicated as selected source line SL0, selected bit line BL0 and selected word line WL0.

As depicted in FIG. 15A, selected source line SL0 and selected bit line BL0 are grounded (PW0=BL0=0 V) and selected word line E0 is biased at a control gate tunnel voltage E0 (for example 15 V).

N-well biasing voltage NW is set at a high, N-well erase value, e.g., at 15 V. Also here, thus, parasitic diode 37 (FIG. 9) is reverse biased and thus always off.

In addition, non-selected source line SL1 and non-selected bit line BL1 are biased at a first inhibit voltage at intermediate level, e.g., E0/3 (in the instant example, PW1=BL1=5 V); non-selected word lines E1, E2, E3 are biased at a second inhibit voltage, higher than first inhibit voltage, e.g., ⅔ E0 (in the instant example, E1=E2=E3=10 V).

Since the capacitive coupling between the floating gate region 21' and the P-well 12' is higher than the capacitive coupling between the floating gate 21' and the N-well portion 11B and considering the above biasing (NW=E0=15 V, BL0=PW0=0 V), the floating gate region 21' is maintained at a potential close to that of the P-well 12' (about 0 V).

Therefore, selected memory cell 60-2 sees a high voltage drop between its floating gate region 21' and N-well portion 11B (as well as the first and second control gate regions 24', 25'). This high voltage drop causes electrons to be extracted from floating gate region 21' toward N-well portion 11B, first control gate region 24' and second control gate region 25' by Fowler-Nordheim effect, as shown in FIG. 15A by arrow 56.

Non-selected memory cell 60-1 of the selected basic unit 50-1 (coupled to non-selected word line E1 at the second intermediate voltage, here at 10 V) has a smaller voltage drop between its floating gate region 21' (at about 0 V because its first and second conduction regions 16', 17' and its first well contact region 15' are grounded) and its first and second control gate regions 24', 25'; therefore non-selected memory cell 60-1 is not erased.

Non-selected memory cell 60-3, coupled to selected word line E0 at high erase voltage (15V), but having its floating gate region 21' at about the first intermediate voltage at 5V (or slightly higher than the first intermediate voltage), is also not erased.

Non-selected memory cell 60-4 in the non-selected sector 102-1 and non-selected memory cells 60-i and 60-j in the non-selected sectors 102-2 and 102-3 are also not erased, for the similar reasons to non-selected memory cell 60-3.

Summarizing, erasing is done by applying a low voltage to the first and second conduction regions 16', 17' of the selected memory cell 1', thereby causing the floating gate region 21' to be capacitively coupled to the low voltage, and by applying a high tunnelling voltage to the first control gate region 24', thereby causing a tunnelling current to flow between the first control gate region 24' and the second portion 21C' of the floating gate region 21' by Fowler-Nordheim effect.

In addition, the N-well portions 11B and the second control gate region 25' are biased at a high voltage, e.g. the same as the tunnelling voltage.

Programming

As indicated above, in this embodiment, programming is a non-selective operation and is performed using the BBHE effect. As is known (see, e.g., "Device Characteristics of 0.35 µm P-Channel DINOR Flash Memory Using Band-to-Band Tunneling-Induced Hot Electron (BBHE) Programming" by Takahiro Ohnakado et al., IEEE Transactions on Electron Devices, Vol. 46, No. 9, September 1999), in traditional memory cells, this effect is based on applying a negative drain voltage and a positive control gate voltage to a cell so as to generate electron-hole pairs in the drain region. The electrons are accelerated by a lateral electric field toward the channel region and those achieving a high energy level are injected into the floating gate region through the tunnel oxide.

In particular, FIG. 16A show the behaviour of the memory cells 60-2 and 60-3, of the selected sector 102-0 and non-selected memory cells 60-1 and 60-4, of the non-selected sector 102-1 and FIG. 16B show the behaviour of the memory cells 60-$i$, 60-$i$+1 and 60-$j$ of the non-selected sectors 102-2, 102-3. Hereinbelow, memory cells 60-1 and 60-4 that form base units 50-1 and 50-2 with the selected memory cells 60-2 and 60-3 are called non-selected sector, selected unit memory cells 60-1 and 60-3; while non-selected memory cells 60-$i$, 60-$i$+1 and 60-$j$ are called non-selected sector, non-selected unit memory cells 60-$i$, 60-$i$+1 and 60-$j$.

As depicted in FIG. 15A, all source lines $SL_0$, SL1 and all bit lines BL0, BL1 are coupled to a bit line program voltage (PW0=PW1=BL0=BL1=5 V); selected word line E0 is brought to an program voltage (for example 5 V), the non-selected word line E1 coupled to non-selected sector, selected unit memory cells 60-1 and 60-3 is grounded and non-selected word lines E2, E3 coupled to the non-selected sector, non-selected unit memory cells 60-$i$, 60-$i$+1 and 60-$j$ at brought to a program preventing voltage, close to the bit line program voltage, for example 5 V.

N-well biasing voltage NW is set at an N-well program value, e.g., at 5 V. Also here, thus, parasitic diode 37 (FIG. 9) is reverse biased and thus off for all sectors 102'.

Because of the capacitive coupling between the floating gate region 21' and the substrate 10 and since P-well 12', first and second conduction regions 16', 17', and N-well 11' are at the bit line or N-well program value (here, 5 V), selected memory cells 60-2 and 60-3 have their floating gate regions 21' at a voltage close thereto (here, e.g., at 4.5 V).

In addition, the parasitic diodes 85 (FIG. 9) formed between the first control gate region 24' (at 0 V) and N-well portions 11B (at N-well program value, here at 5 V) as well as between second control gate region 25' (also at 0 V) and N-well portions 11B of the selected memory cells 60-2 and 60-3 are inversely biased at voltage 5 V. Therefore, inverse breakdown occurs and an electron current is generated near access insulating layer 27', causing injection of higher energy electrons into the electrode portion 21C' of floating gate regions 21' (at about the programming voltage). Therefore, the selected memory cells 60-2 and 60-3 are programmed. The injection of electrons in the selected memory cells 60-2 and 60-3 is represented in FIG. 16A by arrows 57.

Vice versa, non-selected sector, selected unit memory cells 60-1 and 60-3 have the floating gate regions 21', the first and second conduction regions 16', 17', P-wells 12', and N-well if at about the same programming voltage and therefore are not programmed.

The non-selected sector, non-selected unit memory cells 60-$i$, 60-$i$+1 and 60-$j$ are biased analogously to the non-selected sector, selected unit memory cells 60-1 and 60-3 and thus are also not programmed.

Summarizing, programming is done by:
biasing the floating gate region 21' of a selected memory cell memory cell 1' at a floating gate program voltage through the first conduction region 16';
biasing the second body 11B at a body program voltage;
biasing the first control gate region 24' at a control programming voltage, thereby generating a voltage drop between the second portion 21C' of the floating gate region 21' and the first control gate region 24' and a breakdown current to flow between the first control gate region 24' and the N-well portion 11B, electrical charges in the breakdown current being injected from the N-well portion 11B into the electrode portion 21C' of the floating gate region 21' by Band-to-Band Hot Electron Injection effect.

The floating gate program voltage and the body program voltage are higher than the control programming voltage, and the electrical charges are electrons.

The advantages of the present invention are clear from the above.

In particular, it is underlined that, in all embodiments, memory cells 1, 1' allow a reduction in the occupied area, by virtue of the absence of selection transistors and related signal processing elements in the row decoder 125 of FIG. 1.

For example, row-decoder select drivers may be eliminated in the row decoder 125 of FIG. 1.

In the embodiment of FIG. 8, space is also saved by virtue of the specific arrangement of the read MOS transistors 2 and access MOS transistors 3.

In the embodiment of FIGS. 11-16B, space is also saved by virtue of the specific arrangement including basic units 50 sharing contacts and single control and biasing regions for pairs of bit lines and P-wells (source lines).

In addition, in embodiment of FIGS. 11-16B, space is also saved by virtue of the elimination of vertical portions of the N-well between the P-wells accommodating the read MOS transistors 2' and access MOS transistors 3'.

Furthermore, programming may be done at low voltage (in the discussed embodiment, at 5 V), while erasing provides high voltages only in the word lines and in the N-well biasing lines (where only a reduced number of second well contact regions 23' may be provided, for example a few contact regions 23' for each sector 102'). Therefore, in a manner clear to the person skilled in the art, high-voltage chains in the column decoder 115 of FIG. 1 may be simplified, allowing an area reduction of 20%.

Thereby, an area saving of up to 63% may be attained in the memory cell dimensions, causing about 10% area gain at chip level for a typical memory device embedding a 128k FTP memory cells.

The memory cells 1, 1' may be manufactured using a CMOS/BCD technology without any added masks and may be easily integrated in any end product.

The use of FN-tunnelling effect for both erasing and programming in the embodiments of FIGS. 2-8 and of FN-tunnelling effect for erasing and BBHE effect for programming in the embodiments of FIGS. 9-16B allow the memory device 100 to operate a very low power compared to other memories using other Hot Electron effects.

Finally, it is clear that numerous variations and modifications may be made to the memory cells, memory array and biasing method described and illustrated herein, all falling within the scope of the invention as defined in the attached claims.

For example, in the embodiment of FIGS. 2-8, the memory MOS transistors 2 and the access MOS transistors 3 may be of opposite type (P-channel instead of N-channel) or of different type (one NMOS and one PMOS). In the embodiments of FIGS. 9-16B, the memory MOS transistors 2 and the access MOS transistors 3 may be both PMOS.

In the embodiment of FIGS. 9-16C, instead of two implanted regions (first and second control gate regions 24', 25') a single implanted region may be provided or just one of them may be contacted, reducing the area needed to form vias and contacts.

A differential scheme in the memory array 105 may be provided, to store each bit in two complementary cells, for reliability reasons, in a manner known to the person skilled in the art.

If desired, one of the first and second control gate regions 24', 25' may be missing.

What is claimed is:

1. A non-volatile memory array, comprising:
   a pair of non-volatile memory cells, each non-volatile memory cell having:
      a first body and a second body,
      a storage transistor in the first body having a first conduction region and a second conduction region delimited by a channel region,
      a control gate region in the second body,
      a single floating gate region embedded in an insulating region, the single floating gate region having a first portion on the first body and a second portion on the second body, the first portion and the second portion being connected and electrically coupled,
      a first selection via, a second selection via, and a third selection via configured to electrically couple the first conduction region through a first conduction node to a source line, the second conduction region through a second conduction node to a bit line, and the control gate region through a first control node coupled to a word line shared between the pair of non-volatile memory cells, respectively,
   wherein the pair of non-volatile memory cells are configured to be programmed together by applying a first programming voltage, a second programming voltage, and a third programming voltage to the first conduction region, the control gate region, and the second body of each of the non-volatile memory cells, respectively, and
   wherein, by applying the first, second, and third programming voltages, a voltage drop is generated between the second portion and the control gate region, a breakdown current flows between the control gate region and the second body, and electrical charges in the breakdown current are injected from the second body into the second portion by Band-to-Band Hot Electron Injection effect.

2. The non-volatile memory array according to claim 1, wherein for each non-volatile memory cell, the first body comprises a first well and the second body comprises a second well isolated from the first well.

3. The non-volatile memory array according to claim 1, wherein for each non-volatile memory cell, the first and second bodies are wells of a first conductivity type, wherein a well region of a second conductivity type accommodates the first and second bodies, wherein an isolation portion extends between a first well of the first body and a second well of the second body, and wherein the first conduction region, the second conduction region, and the first control gate region are of the second conductivity type.

4. The non-volatile memory array according to claim 1, wherein for each non-volatile memory cell, the first portion of the single floating gate region is smaller than the second portion of the single floating gate region.

5. The non-volatile memory array according to claim 1, wherein each non-volatile memory cell further comprises:
   a body biasing via extending through the insulating region and electrically coupling the first body with a first body biasing node,
   wherein the pair of non-volatile memory cells are configured to be programmed by applying the second programming a first voltage to the first control gate region and the first programming voltage to the first body, the first and second programming voltages generating a voltage drop between the first portion of the single floating gate region and the first body and causing first electrical charges to flow from the first body into the first portion of the single floating gate region by Fowler-Nordheim tunnelling, wherein the second programming voltage is higher than the first programming voltage and the first electrical charges are electrons.

6. The non-volatile memory array according to claim 1, wherein for each non-volatile memory cell, the control gate region is electrically directly coupled to the second body.

7. The non-volatile memory array of claim 1, further comprising:
   a first bit line;
   a first source line;
   a first word line; and
   a first non-volatile memory cell of the non-volatile memory array,
   wherein the first conduction node of the first non-volatile memory cell is coupled to the first source line,
   wherein the second conduction node of the first non-volatile memory cell is coupled to the first bit line, and
   wherein the first control node of the first non-volatile memory cell is coupled to the first word line.

8. A method for reading a first non-volatile memory cell of the non-volatile memory array according to claim 1, the method comprising:
   applying a first biasing voltage to the first conduction node of the first non-volatile memory cell;
   applying a second biasing voltage to the second conduction node of the first non-volatile memory cell;
   applying a read voltage to the first control node of the first non-volatile memory cell; and
   detecting whether a current flows between the first and second conduction regions through the first channel region.

9. A method for erasing a first non-volatile memory cell of the non-volatile memory array according to claim 1, the method comprising:
   biasing the single floating gate region of the first non-volatile memory cell at a first floating gate erase voltage through the second body;
   biasing the first body of the first non-volatile memory cell at a first body erase voltage, thereby generating a voltage drop between the first portion of the single floating gate region of the first non-volatile memory cell and the first body of the first non-volatile memory cell; and
   extracting electrical charges from the first portion of the single floating gate region of the first non-volatile memory cell to the first body by Fowler-Nordheim tunnelling.

10. A non-volatile memory array, comprising:
   a pair of non-volatile memory cells, each non-volatile memory cell having:
      a first body and a second body,
      a storage transistor in the first body having a first conduction region and a second conduction region delimited by a channel region,
      a control gate region in the second body,
      a single floating gate region embedded in an insulating region, the single floating gate region having a first portion on the first body and a second portion on the second body, the first portion and the second portion being connected and electrically coupled, a first selection via, a second selection via, and a third selection via configured to electrically couple the first conduction region through a first conduction node to a source line, the second conduction region through a second conduction node to a bit line, and the control gate region through a first control node coupled to a word line shared between the pair of non-volatile memory cells, respectively, wherein the pair of non-volatile memory cells are configured to be separately erased by applying a first erase voltage and a second erase voltage to the first conduction region and the control gate region respectively, and wherein, by applying the first erase voltage and the second erase voltage, an erase voltage drop is generated between the second portion and the control gate region and a tunneling current flows between the control gate region and the second portion by Fowler-Nordheim effect.

11. The non-volatile memory array according to claim 10, wherein for each non-volatile memory cell, the first body comprises a first well and the second body comprises a second well isolated from the first well.

12. The non-volatile memory array according to claim 10, wherein for each non-volatile memory cell, the first and second bodies are wells of a first conductivity type, wherein a well region of a second conductivity type accommodates the first and second bodies, wherein an isolation portion extends between a first well of the first body and a second well of the second body, and wherein the first control gate region is of the second conductivity type.

13. The non-volatile memory array according to claim 10, wherein for each non-volatile memory cell, the first portion of the single floating gate region is smaller than the second portion of the single floating gate region.

14. The non-volatile memory array of claim 10, wherein each non-volatile memory cell further comprises:
a body biasing via extending through the insulating region and electrically coupling the first body with a first body biasing node,
wherein the pair of non-volatile memory cells are configured to be programmed by applying the second programming voltage to the first control gate region and the first programming voltage to the first body, the first and second programming voltages generating a voltage drop between the first portion of the single floating gate region and the first body and causing first electrical charges to flow from the first body into the first portion of the single floating gate region by Fowler-Nordheim tunnelling, wherein the second programming voltage is higher than the first programming voltage and the first electrical charges are electrons.

15. The non-volatile memory array of claim 10, further comprising:
a first bit line;
a first source line;
a first word line; and
a first non-volatile memory cell of the non-volatile memory array,
wherein the first conduction node of the first non-volatile memory cell is coupled to the first source line,
wherein the second conduction node of the first non-volatile memory cell is coupled to the first bit line, and
wherein the first control node of the first non-volatile memory cell is coupled to the first word line.

16. The non-volatile memory array according to claim 10, wherein for each non- volatile memory cell, the control gate region is electrically directly coupled to the second body.

17. A method for reading a first non-volatile memory cell of the non-volatile memory array according to claim 10, the method comprising:
applying a first biasing voltage to the first conduction node of the first non-volatile memory cell;
applying a second biasing voltage to the second conduction node of the first non-volatile memory cell;
applying a read voltage to the first control node of the first non-volatile memory cell; and
detecting whether a current flows between the first and second conduction regions through the first channel region.

18. A method for programming a first non-volatile memory cell of the non-volatile memory array according to claim 10, the method comprising:
biasing the single floating gate region of the first non-volatile memory cell at a first floating gate program voltage through the second body of the first non-volatile memory cell;
biasing the first body of the first non-volatile memory cell at a first body program voltage, thereby generating a voltage drop between the first portion of the single floating gate of the first non-volatile memory cell region and the first body of the first non-volatile memory cell; and
injecting electrical charges from the first body of the first non-volatile memory cell into the first portion of the single floating gate region of the first non-volatile memory cell by Fowler-Nordheim tunnelling.

19. A method for erasing a first non-volatile memory cell of the non-volatile memory array according to claim 10, the method comprising:
biasing the single floating gate region of the first non-volatile memory cell at a first floating gate erase voltage through the second body;
biasing the first body of the first non-volatile memory cell at a first body erase voltage, thereby generating a voltage drop between the first portion of the single floating gate region of the first non-volatile memory cell and the first body of the first non-volatile memory cell; and
extracting electrical charges from the first portion of the single floating gate region of the first non-volatile memory cell to the first body by Fowler-Nordheim tunnelling.

20. A non-volatile memory array, comprising:
a pair of non-volatile memory cells, each non-volatile memory cell having:
a first body and a second body,
a storage transistor in the first body having a first conduction region and a second conduction region delimited by a channel region,
a control gate region in the second body,
a single floating gate region embedded in an insulating region, the single floating gate region having a first portion on the first body and a second portion on the second body, the first portion and the second portion being connected and electrically coupled,
a first selection via, a second selection via, and a third selection via configured to electrically couple the first conduction region through a first conduction node to a source line, the second conduction region through a second conduction node to a bit line, and the control gate region through a first control node coupled to a word line shared between the pair of non-volatile memory cells, respectively, wherein the pair of non-volatile memory cells are configured to be separately erased by applying a first erase voltage and a second erase voltage to the first conduction region and the control gate region, respectively, wherein, by applying the first erase voltage and the second erase voltage, an erase voltage drop is generated between the second portion and the control gate region and a tunneling current flows between the control gate region and the second portion by Fowler-Nordheim effect, wherein the pair of non-volatile memory cells are configured to be programmed together by applying a first programming voltage, a second programming voltage, and a third programming voltage to the first conduction region, the control gate region, and the second body of each of the non-volatile memory cells, respectively, and wherein, by applying the first, second, and third programming voltages, a voltage drop is generated between the second portion and the control gate region, a breakdown current flows between the control gate region and the second body, and electrical charges in the breakdown current are injected from the second body into the second portion by Band-to-Band Hot Electron Injection effect.

21. The non-volatile memory array according to claim 20, wherein for each non-volatile memory cell, the control gate region is electrically directly coupled to the second body.

* * * * *